(12) United States Patent
Krause et al.

(10) Patent No.: US 10,978,611 B2
(45) Date of Patent: Apr. 13, 2021

(54) SEMICONDUCTOR STRUCTURE WITH CHIRP LAYER

(71) Applicant: Silanna UV Technologies Pte Ltd, Singapore (SG)

(72) Inventors: Norbert Krause, Hawthorne (AU); Guilherme Tosi, Yeerongpilly (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 17/062,369

(22) Filed: Oct. 2, 2020

(65) Prior Publication Data

US 2021/0036183 A1 Feb. 4, 2021

Related U.S. Application Data

(63) Continuation of application No. PCT/IB2019/052675, filed on Apr. 1, 2019.
(Continued)

(51) Int. Cl.
*H01L 33/04* (2010.01)
*H01L 33/32* (2010.01)
(Continued)

(52) U.S. Cl.
CPC ............ *H01L 33/04* (2013.01); *H01L 29/151* (2013.01); *H01L 29/2003* (2013.01);
(Continued)

(58) Field of Classification Search
CPC combination set(s) only.
See application file for complete search history.

(56) References Cited

U.S. PATENT DOCUMENTS 6,504,171 B1   1/2003  Grillot et al.
8,575,592 B2  11/2013  Bergmann et al.
(Continued)

FOREIGN PATENT DOCUMENTS

WO    2015181657 A1    12/2015

OTHER PUBLICATIONS

Huapu Pan et al. Measurement and Modeling of High-Linearity Modified Uni-Traveling Carrier Photodiode with Highly-Doped Absorber. Optics Express, vol. 17, No. 22, Oct. 26, 2009, pp. 20221-20226.
(Continued)

*Primary Examiner* — Matthew L Reames
(74) *Attorney, Agent, or Firm* — MLO, a professional corp.

(57) ABSTRACT

A semiconductor structure can comprise a plurality of first semiconductor layers comprising wide bandgap semiconductor layers, a narrow bandgap semiconductor layer, and a chirp layer between the plurality of first semiconductor layers and the narrow bandgap semiconductor layer. The values of overlap integrals between different electron wavefunctions in a conduction band of the chirp layer can be less than 0.05 for intersubband transition energies greater than 1.0 eV, and/or the values of overlaps between electron wavefunctions and barrier centers in a conduction band of the chirp layer can be less than 0.3 $nm^{-1}$, when the structure is biased at an operating potential. The chirp layer can comprise a short-period superlattice with alternating wide bandgap barrier layers and narrow bandgap well layers, wherein the thickness of the barrier layers, or the well layers, or the thickness of both the barrier and well layers changes throughout the chirp layer.

28 Claims, 15 Drawing Sheets

Related U.S. Application Data

(60) Provisional application No. 62/653,750, filed on Apr. 6, 2018.

(51) Int. Cl.
    *H01S 5/32*         (2006.01)
    *H01L 29/15*       (2006.01)
    *H01S 5/30*         (2006.01)
    *H01L 29/20*       (2006.01)

(52) U.S. Cl.
    CPC ............ *H01L 33/32* (2013.01); *H01S 5/3013* (2013.01); *H01S 5/3206* (2013.01)

(56) References Cited

U.S. PATENT DOCUMENTS

| | | |
|---|---|---|
| 2003/0118066 A1 | 6/2003 | Bour et al. |
| 2010/0309943 A1 | 12/2010 | Chakraborty et al. |
| 2011/0187294 A1 | 8/2011 | Bergmann et al. |
| 2011/0243172 A1 | 10/2011 | Lin et al. |
| 2014/0353677 A1 | 12/2014 | Tak et al. |
| 2015/0318448 A1 | 11/2015 | Nan et al. |
| 2016/0149074 A1 | 5/2016 | Atanackovic et al. |
| 2016/0163920 A1 | 6/2016 | Atanackovic |
| 2017/0110628 A1 | 4/2017 | Shatalov et al. |

OTHER PUBLICATIONS

International Search Report dated Jul. 5, 2019 for PCT Patent Application No. PCT/IB2019/052675.

SEMICONDUCTOR STRUCTURE WITH CHIRP LAYER

RELATED APPLICATIONS

This application is a continuation of International Application No. PCT/IB2019/052675 filed on Apr. 1, 2019, and entitled "SEMICONDUCTOR STRUCTURE WITH CHIRP LAYER"; which claims the benefit of U.S. Provisional Patent Application No. 62/653,750 filed on Apr. 6, 2018, and entitled "UV-C LED WITH IMPROVED LIFETIME;" both of which are hereby incorporated by reference for all purposes.

BACKGROUND

In short wavelength light emitting diode (LED) devices (e.g., UV-C LEDs), electrons and holes recombine in a wide-bandgap intrinsic region to generate photons. Efficient hole doping in wide-bandgap materials is extremely challenging, and therefore UV-C LEDs most commonly have a narrow-bandgap p-doped contact layer (e.g., p-type GaN). Electrons in the intrinsic region can overshoot into the narrower bandgap region, where they will then have an excess energy of the order of an electron-volt (eV). That energy from the hot electrons can be released into the crystal in a variety of forms that can cause permanent damage. For example, the energy from the hot electrons can be absorbed by defects on a scattering event, and the absorbed momentum and can move those defects inside the crystal lattice. The energy from the hot electrons can also change the local strain and possibly also affect the number of non-radiative recombination centers, which can decrease the device efficiency over time and therefore limit its lifetime performance.

Furthermore, many other semiconductor devices requiring electrons to travel from a wide bandgap region to a narrow bandgap region can suffer from similar hot electron problems. Some non-limiting examples of semiconductor devices that can suffer from hot electron problems are LEDs with other wavelengths (e.g., UV-A LEDs), bipolar junction transistors, power transistors, vertical field-effect transistors, and semiconductor lasers. Some non-limiting examples of materials systems that can be used in devices that can suffer from hot electron problems are GaN/AlGaN/AlN, GaAs/AlGaAs/AlAs, ZnO/MgZnO/MgO, and $Ga_2O_3/(Al,Ga)_2O_3/Al_2O_3$.

SUMMARY

In some embodiments, a semiconductor structure comprises a plurality of first semiconductor layers comprising wide bandgap semiconductor layers, a narrow bandgap semiconductor layer, and a chirp layer between the plurality of first semiconductor layers and the narrow bandgap semiconductor layer. In some embodiments, the values of overlap integrals between different electron wavefunctions in a conduction band of the chirp layer are less than 0.05 for intersubband transition energies greater than 1.0 eV, when the structure is biased at an operating potential. In some embodiments, the values of overlaps between electron wavefunctions and barrier centers in a conduction band of the chirp layer are less than 0.3 $nm^{-1}$, when the structure is biased at an operating potential.

In some embodiments, a semiconductor structure comprises a plurality of first semiconductor layers comprising wide bandgap semiconductor layers, a narrow bandgap semiconductor layer, and an unintentionally doped chirp layer between the plurality of first semiconductor layers and the narrow bandgap semiconductor layer. In some embodiments, the plurality of first semiconductor layers comprise an n-type short-period superlattice layer and an unintentionally doped short-period superlattice layer (SPSL) between the n-type short-period superlattice layer and the unintentionally doped chirp layer. In some embodiments, the unintentionally doped chirp layer comprises a SPSL with alternating wide bandgap barrier layers and narrow bandgap well layers, wherein the thickness of the barrier layers, or the well layers, or the thickness of both the barrier and well layers changes throughout the chirp layer.

DETAILED DESCRIPTION

The present disclosure describes semiconductor devices requiring electrons to travel from a wide bandgap region to a narrow bandgap region with structures that are engineered in such a way that the electron energy is released in small steps as the electrons travel from the wide bandgap region to the narrow bandgap region. In some embodiments, the structures of the present devices mitigate or eliminate structural device changes due to hot electrons, and as a result have improved lifetimes compared to conventional devices. Some non-limiting examples of semiconductor devices that can benefit from the present embodiments are short wavelength light emitting diode (LED) devices (e.g., UV-C LEDs), LEDs with other wavelengths (e.g., UV-A LEDs), bipolar junction transistors, power transistors, vertical field-effect transistors, and semiconductor lasers. Some non-limiting examples of materials systems that can be used in the present devices are GaN/AlGaN/AlN, InGaAlN containing systems, GaAs/AlGaAs/AlAs, ZnO/MgZnO/MgO, and $Ga_2O_3/(Al,Ga)_2O_3/Al_2O_3$.

In some embodiments, a semiconductor device contains a plurality of semiconductor layers comprising wide bandgap semiconductor layers, a narrow bandgap semiconductor layer, and a chirp layer between the wide bandgap semiconductor layers and the narrow bandgap semiconductor layer. The terms "wide bandgap" and "narrow bandgap" are relative to one another, and the important property of the present devices is that the difference between bandgaps (or effective bandgaps in the case of layers containing superlattices) of layers in the structure is relatively large. The difference between bandgaps (or effective bandgaps in the case of layers containing superlattices) in the layers in the present structures can be greater than 1.0 eV, or greater than 1.5 eV, or greater than 2.0 eV, or greater than 2.5 eV, or greater than 3.0 eV, or greater than 3.5 eV, or greater than 4.0 eV, or from 1.0 eV to 4.0 eV, or from 2.0 eV to 4.0 eV, in different embodiments. The term "wide bandgap" can refer to bandgaps that are greater than 2.0 eV, or greater than 2.5 eV, or greater than 3.0 eV, or greater than 3.5 eV, or greater than 4.0 eV, in different embodiments. The term "narrow bandgap" can refer to bandgaps that are less than 4.0 eV, or less than 3.5 eV, or less than 3.0 eV, or less than 2.5 eV, or less than 2.0 eV, or less than 1.5 eV, or less than 1.0 eV, in different embodiments. The term "chirp layer" as used herein refers to a layer that contains an aperiodic superlattice containing wide bandgap layers and narrow bandgap layers. The thicknesses of the wide bandgap layers and/or narrow bandgap layers within the chirp layers described herein can vary monotonically or non-monotonically throughout the chirp layer.

Figure 1A:
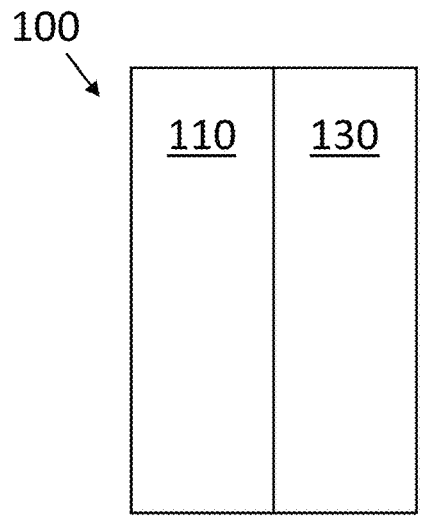
FIG. 1A is a simplified schematic of a conventional semiconductor structure.
Figure 1B:
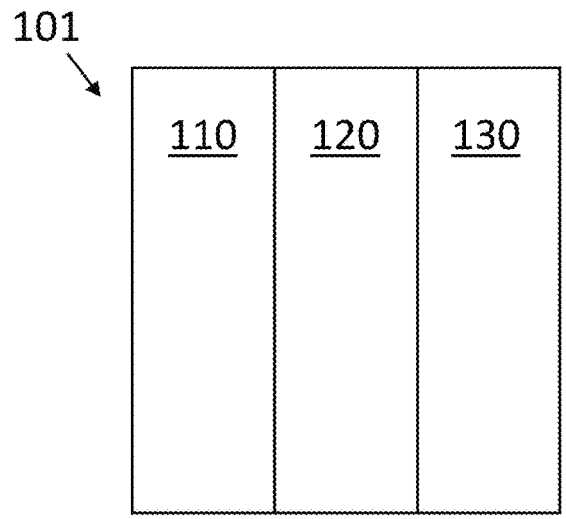
FIG. 1B is a simplified schematic of a semiconductor structure, in accordance with some embodiments.
Figure 1C:
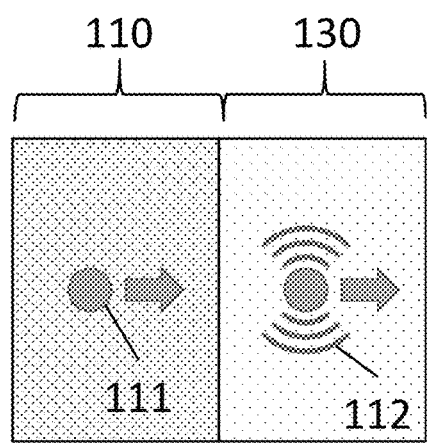
FIG. 1C is a simplified schematic of an electron moving through the conventional semiconductor structure in FIG. 1A.
Figure 1D:
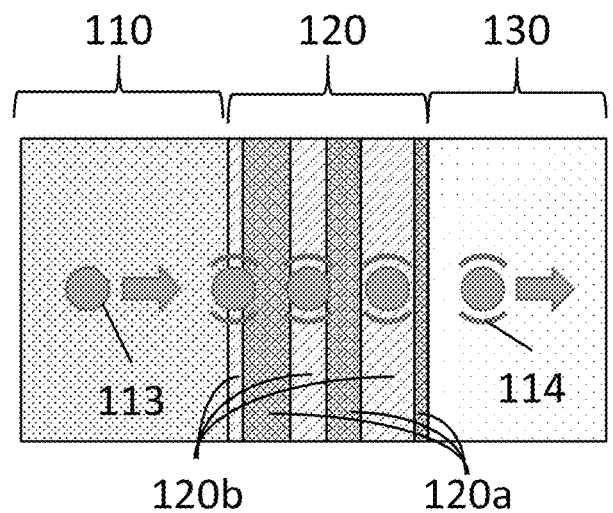
FIG. 1D is a simplified schematic of an electron moving through the semiconductor structure in FIG. 1B, in accordance with some embodiments.

FIG. 1A shows a conventional semiconductor structure with a layer 110 containing a wide bandgap semiconductor, and an adjacent layer 130 containing a narrow bandgap semiconductor. FIG. 1B shows a present semiconductor structure with a layer 110 containing a wide bandgap semiconductor, a layer 130 containing a narrow bandgap semiconductor, and a layer 120 between layers 110 and 130 that contains a chirp layer. FIG. 1C illustrates an electron 111 moving through the conventional structure 100 from left to right in the figure. When the electron 111 moves from the layer 110 to the layer 130 it loses a large amount of energy 112 in a single step (as depicted by the multiple curved lines 112 around the electron in layer 130). FIG. 1D illustrates an electron 113 moving through the present structure 101 (containing the chirp layer 120) from left to right in the figure. The wide bandgap layers 120a and the narrow bandgap layers 120b in chirp layer 120 are shown in this figure as well. In some cases, layers 110, 120 and 130 are composed of the same wide bandgap materials (e.g., AlN) and the same narrow bandgap materials (e.g., GaN). In other embodiments, layer 110 contains a first set of wide bandgap materials, layer 120 contains a second set of wide bandgap materials and narrow bandgap materials, and layer 130 contains a third set of narrow bandgap materials, where the first, second and third sets of materials can be the same or different from one another. For example, the first set of wide bandgap materials in layer 110 can contain AlGaInN with a composition providing a wide bandgap, and the chirp layer 120 can contain an AlN/GaN chirped superlattice, and layer 130 can contain AlGaInN with a composition providing a narrow bandgap. The non-limiting example shown in FIG. 1D depicts the thickness of the wide bandgap layers 120a in the chirp layer 120 changing in a certain way through the chirp layer 120, and the narrow bandgap layers 120b in the chirp layer 120 changing thickness in a certain way through the chirp layer 120. However, in other embodiments, the thicknesses of the wide and/or narrow bandgap layers in the chirp layer can change thickness in other ways not shown in FIG. 1D. In the embodiment shown in FIG. 1D, the electron 113 loses small amounts of energy 114 in several steps as it moves through the chirp layer 120 (as depicted by the single curves lines 114 around the electron in layers 120 and 130). This is advantageous, because electrons releasing large amounts of energy in a semiconductor device can lead to device degradation.

The structures shown in FIGS. 1A-1D can be incorporated into any semiconductor device where electrons move from regions containing wider bandgap semiconductors to regions containing narrower bandgap semiconductors, such as short wavelength light emitting diode (LED) devices (e.g., UV-C LEDs), LEDs with other wavelengths (e.g., UV-A LEDs), bipolar junction transistors, power transistors, vertical field-effect transistors, and semiconductor lasers. In some cases, incorporating a structure similar to structure 101 into any of the above semiconductor devices can improve the lifetime (i.e., reduce degradation over time) of the device.

In some embodiments, the wide bandgap layers contain an n-type material (e.g. AlGaInN), which can be arranged in a bulk, a short-period superlattice (SPSL) or any other structural form. In some embodiments, the narrow bandgap layers contain a p-type material in any of the forms described above. In some embodiments, an unintentionally doped layer is placed between the n-type or p-type material and the unintentionally doped chirp layer. The term "unintentionally doped" as used herein refers to a semiconductor layer that does not have a chemical dopant (i.e., impurity atoms) intentionally added, but rather is chemically doped due defects and/or impurities unintentionally introduced during growth. In some cases, an unintentionally doped layer (i.e., with a low doping density due to chemical doping) can have a high carrier concentration (e.g., a high hole concentration) due to polarization doping.

In some embodiments, the chirp layer is unintentionally doped. In some embodiments, the chirp layer has a high carrier concentration due to polarization doping. In other embodiments the chirp layer is intentionally doped (e.g., heavily doped, moderately doped, lightly doped, n-type doped, or p-type doped).

The chirp layer can contain an SPSL with thin (e.g., less than approximately 5 nm thick) alternating wide bandgap layers (barriers) and narrow bandgap layers (quantum wells). The chirp layer can contain wide and narrow bandgap semiconductors where the wide and/or narrow bandgap semiconductors can each contain 2, 3, 4, 5, 6 or more than 6 elements, where the composition of each semiconductor is tuned to provide the intended bandgap. For example, the chirp layer can contain alternating layers of AlN/GaN, AlN/Al$_x$Ga$_{(1-x)}$N (e.g., where x is between approximately 0 approximately 0.9), Al$_x$Ga$_{(1-x)}$N/GaN (e.g., where x is between approximately 0.1 and approximately 0.5), or Al$_x$Ga$_{(1-x)}$N/Al$_y$Ga$_{(1-y)}$N (e.g., where x and y are chosen such that one layer is a wide bandgap layer and the other layer is a narrow bandgap layer). In some embodiments, the thicknesses of the wide and/or narrow bandgap semiconductor layers vary throughout the chirp layer. In some embodiments, the thicknesses and/or compositions of the wide and/or narrow bandgap semiconductor layers vary throughout the chirp layer. In some embodiments, the chirp layer contains alternating layers of material with different bandgaps, where the materials are not necessarily narrow and wide bandgap semiconductors (as described herein). For example, the chirp layer can contain alternating layers of Al$_x$Ga$_{(1-x)}$N/Al$_y$Ga$_{(1-y)}$N, where x and y are selected so that the chirp layer contains two different materials. One non-limiting example of such a chirp layer would be one that contains alternating layers of AlN/Al$_{0.8}$Ga$_{0.2}$N. In some embodiments, the chirp layer is designed to mitigate the concentration (or flux) of hot electrons, for example, by tuning the thicknesses of the barriers and wells within the SPSL to optimize the energy and probability of the allowed intersubband transitions for electrons within the chirp layer.

Not to be limited by theory, if the barriers and wells in the chirp layer are designed such that the electrons moving through the chirp layer have fewer possible high energy intersubband electron transitions, then there will be less opportunity for the electrons to release large amounts of energy during intersubband transitions. In some embodiments, the values of overlap integrals between different electron wavefunctions in a conduction band of the unintentionally doped chirp layer are less than 0.05 for intersubband transition energies greater than 1.0 eV, when the device is under operation. In some embodiments, the overlap integrals between different electron wavefunctions are evaluated when the device is biased to approximately a flatband condition, or with a potential similar to an operating potential for the device. The overlap integral between two electron wavefunctions is the probability of an electron transition from one wavefunction to the other, where a high value indicates a high probability of transition and a low value indicates a low probability of transition. Similarly, the overlap of an electron wavefunction with a particular point in space can also be determined, which describes the probability of the electron existing at the point in space. For example, the overlap of a wavefunction with a point in space can be used to determine the probability of an electron with that wavefunction interacting with a feature (e.g., a defect) at that point in space.

In some embodiments, the thickness of the quantum wells and the barriers within one or more regions of the chirp layer are chosen such that the values of the overlap integrals between different electron wavefunctions in the conduction band of the unintentionally doped chirp layer are less than 0.2, or less than 0.15, or less than 0.1, or less than 0.05 for intersubband transition energies greater than 0.1 eV, or greater than 0.2 eV, or greater than 0.3 eV, 0.4 eV, or greater than 0.5 eV, or greater than 0.6 eV, or greater than 0.7 eV, or greater than 0.8 eV, or greater than 0.9 eV, or greater than 1.0 eV, or greater than 1.1 eV, or greater than 1.2 eV, or greater than 1.4 eV, or greater than 1.6 eV, or greater than 1.8 eV, or greater than 2.0 eV. In some embodiments, the thickness of the quantum wells and the barriers within one or more regions of the chirp layer are chosen such that the values of the overlap integrals between different electron wavefunctions in the conduction band of the unintentionally doped chirp layer are less than 0.2, or less than 0.15, or less than 0.1, or less than 0.05 for intersubband transition energies greater than the activation energies of one or more defect species within the device structure. Having small overlap integral values for high energy transitions indicates that the probability of electrons releasing large amounts of energy in these transitions is small, which can be beneficial for semiconductor device performance, as described herein.

Additionally, not to be limited by theory, if the barriers and wells in the chirp layer are designed such that defects within the wells preferentially move into the barriers, then the detrimental effects of the defects will be mitigated. In some embodiments, the overlaps between electron wavefunctions and barrier centers (or, the probability that the electron is at the barrier center), in a conduction band of the unintentionally doped chirp layer, are less than 0.4 nm$^{-1}$, or less than 0.3 nm$^{-1}$, or less than 0.2 nm$^{-1}$, or less than 0.1 nm$^{-1}$, or less than 0.05 nm$^{-1}$ in one or more regions of the chirp layer. In some embodiments, the thickness of the quantum wells and the barriers within one or more regions of the chirp layer are chosen such that the values of the overlap between the electron or hole wavefunctions and the barrier centers in the conduction or valence bands of the unintentionally doped chirp layer are less than 0.4 nm$^{-1}$, or less than 0.3 nm$^{-1}$, or less than 0.2 nm$^{-1}$, or less than 0.1 nm$^{-1}$, or less than 0.05 nm$^{-1}$, or less than 0.025 nm$^{-1}$. Having small overlap integral values with barrier centers indicates that the probability of electrons interacting with features (e.g., defects) at the barrier centers is small, which can be beneficial for semiconductor device performance, as described herein.

In some embodiments, the overlap integrals between different electron wavefunctions and/or between a wavefunction and the barrier centers are evaluated in the state when the device is biased to a flatband condition, or with a potential similar to an operating potential for the device (e.g., in forward bias ranges typical for LEDs, and/or within 0.5 V, 1.0 V, or 1.5 V of flatband).

In some embodiments, UV-C LEDs contain SPSLs with one or more types of doping (e.g., unintentionally doped SPSLs, polarization doped SPSLs, and/or intentionally doped SPSLs), made up of narrow bandgap quantum wells (e.g., GaN or narrow bandgap AlGaN with thickness less than approximately 5 nm) and wide bandgap barriers (e.g., AlN or wide bandgap AlGaN with thickness less than approximately 5 nm). For example, the present devices can contain an n-type SPSL, followed by an unintentionally doped SPSL, followed by an unintentionally doped chirp layer, which is adjacent to a narrow bandgap p-type layer. In some embodiments, the narrow bandgap p-type layer is needed to supply holes and form an ohmic contact with metal layers.

In some devices the chirp layer is also a SPSL, made up of narrow bandgap quantum wells (e.g., GaN) and wide bandgap barriers (e.g., AlN), where the thickness of the wells and/or barriers is monotonically increased or decreased through the thickness of the layer, in such a way that the local effective bandgap transitions gradually from high to low. The chirp layer can have any type of doping (e.g., unintentionally doped SPSLs, polarization doped SPSLs, and/or intentionally doped SPSLs). In some embodiments, the chirp layer is unintentionally doped, with n-type or p-type chemical doping concentrations less than $5 \times 10^{16}$ cm$^{-3}$, or less than $10^{16}$ cm$^{-3}$, or less than $10^{15}$ cm$^{-3}$, or less than $10^{14}$ cm$^{-3}$, or from less than $10^{14}$ cm$^{-3}$ to $5 \times 10^{16}$ cm$^{-3}$, or from less than $10^{14}$ cm$^{-3}$ to $10^{16}$ cm$^{-3}$. Some examples of free carrier concentrations for n-type or p-type doped layers (e.g., intentionally chemically doped, or unintentionally chemically doped but including polarization doping) are greater than $10^{19}$ cm$^{-3}$, or greater than $10^{18}$ cm$^3$, or greater than $10^{17}$ cm$^{-3}$, or greater than $5 \times 10^{16}$ cm$^{-3}$, or greater than $10^{16}$ cm$^{-3}$, or greater than $10^{15}$ cm$^{-3}$, or from $10^{16}$ cm$^3$ to $10^{19}$ cm$^{-3}$, or from $10^{15}$ cm$^3$ to $10^{19}$ cm$^{-3}$, or from $10^{15}$ cm$^{-3}$ to $10^{20}$ cm$^{-3}$.

In some embodiments, UV-C LEDs contain an n-type SPSL, a p-type SPSL, an unintentionally doped SPSL, and an unintentionally doped chirp layer. For example, SPSLs and chirp layers can be made up of alternating layers of AlN and GaN. In some embodiments, UV-C LEDs further contain a p-type narrow bandgap layer, for example made up of GaN. Other materials for the present UV-C LEDs containing the SPSLs and chirp layers are also possible, such as In$_x$Ga$_y$Al$_z$N (where x+y+z=1, and x, y and z are all between 0 and 1).

Figure 1E:
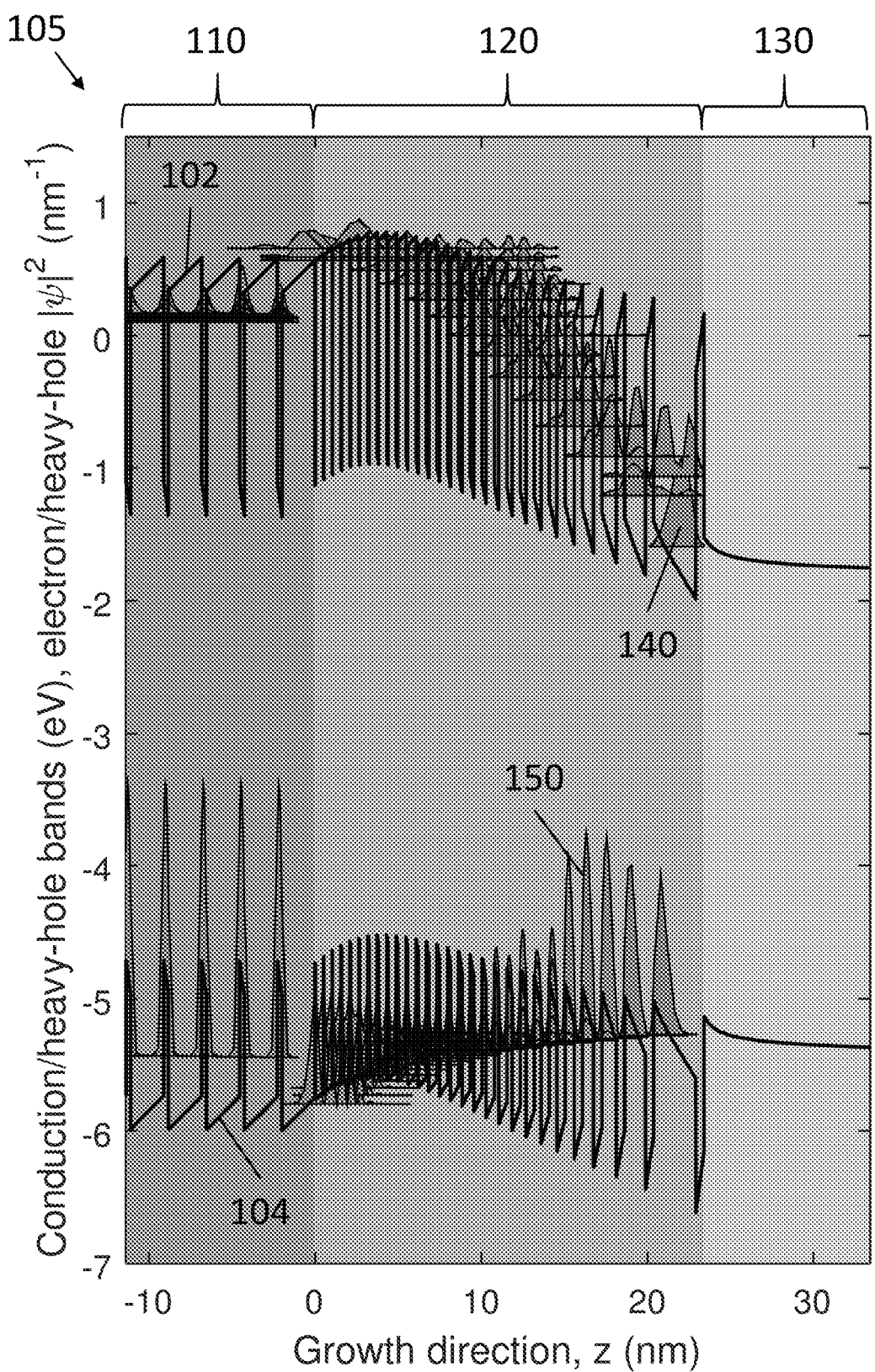
FIG. 1E shows an example of a conduction band profile and valence band profile along the growth direction (z) of a semiconductor structure, in accordance with some embodiments.

FIG. 1E is an example of a conduction band profile 102 and valence band profile 104 along the growth direction (z) of a semiconductor structure (e.g., in a UV-C LED), including a plurality of first semiconductor layers 110 (only partially shown) comprising wide bandgap semiconductor layers, a narrow bandgap layer 130 (only partially shown), and a chirp layer 120 between layers 110 and 130, Layer 110 in the structure modelled in FIG. 1E is unintentionally doped, and can be referred to as an SPSL layer, or an i-layer, herein. In some embodiments, the chirp layers described herein (i.e., in this example, and other examples) can be chemically doped n-type or p-type, and/or polarization doped. FIG. 1E also includes the simulated electron wavefunctions 140 and the hole wavefunctions 150 that are allowed within such a structure. The electron wavefunctions 140 in FIG. 1E are plotted such that the baseline of each of the wavefunctions (i.e., $|\psi|^2=0$, where $\psi$ is the wavefunction) is aligned with their energies (in the vertical direction in the figure). The y-axis in FIG. 1E also shows the magnitude (e.g., height of the wavefunction) of each of the wavefunctions $|\psi|^2$, however, as described above the values on the y-axis relate to the baseline energy of the wavefunctions, and only the intervals in the y-axis are related to the magnitude of the wavefunctions. In the example shown in FIG. 1E, a 5.2 V voltage is applied between p- and n-contacts (i.e., contacts connected to the outermost n-type and p-type materials in the simulated structure), which is equivalent to flatband. This condition is also close to the operating condition for an LED incorporating the structure modelled in FIG. 1E. In this example baseline device, the plurality of first semiconductor layers 110 comprising wide bandgap semiconductor layers contains alternating layers of AlN and GaN. The chirp layer 120 is unintentionally chemically doped, however does have a high hole concentration due to polarization doping. The i-chirp layer 120 is made up of unit cells, where each unit cell contains one wide bandgap barrier layer (AlN) and one narrow bandgap quantum well layer (GaN). In the i-chirp layer 120 in this example, the AlN barrier thicknesses are kept constant at approximately 2 monolayers (ML), while the GaN quantum well thickness monotonically increases, in such a way that the average aluminium content (i.e., the Al content averaged over a unit cell) varies from 100% to 0% within approximately 30 nm.

Figure 1F:
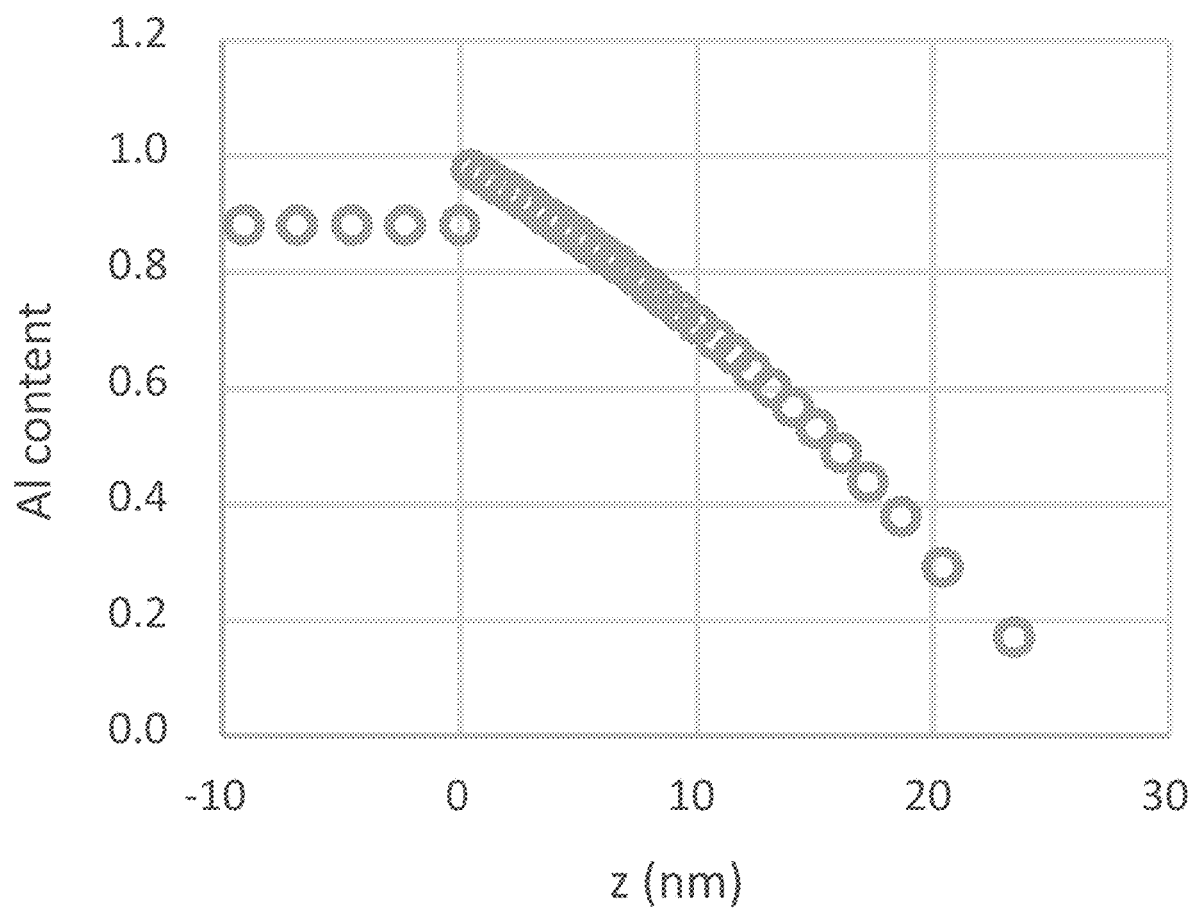
FIG. 1F is a graph showing the average composition of each of the unit cells making up part of the n-layer and the chirp layer of the semiconductor structure simulated in FIG. 1E, in accordance with some embodiments.

FIG. 1F is a graph showing the average composition of each of the unit cells making up part of the n-layer and the i-chirp layer of the baseline semiconductor structure simulated in FIG. 1E. The y-axis of the graph in FIG. 1F is the "Al content", or the composition of Al/(Al+Ga) over each pair of AlN/GaN layers in the i-chirp layer. The x-axis ("z (nm)") is the thickness along the i-chirp layer shown in FIG. 1E, where 0 nm in FIG. 1F corresponds to 0 nm in the "Growth Direction, z (nm)" in FIG. 1E. The GaN wells at the start of the i-chirp layer are very thin, well below a GaN monolayer thickness, which means that only a few regions in the device will actually contain GaN. And since the AlN barriers are approximately 2 ML thick, the average composition is close to 100% Al/(Al+Ga) at the start of the chirp layer. As the GaN well thicknesses increase monotonically, the composition of Al/(Al+Ga) decreases monotonically, as shown in the graph in FIG. 1F.

Figure 1G:
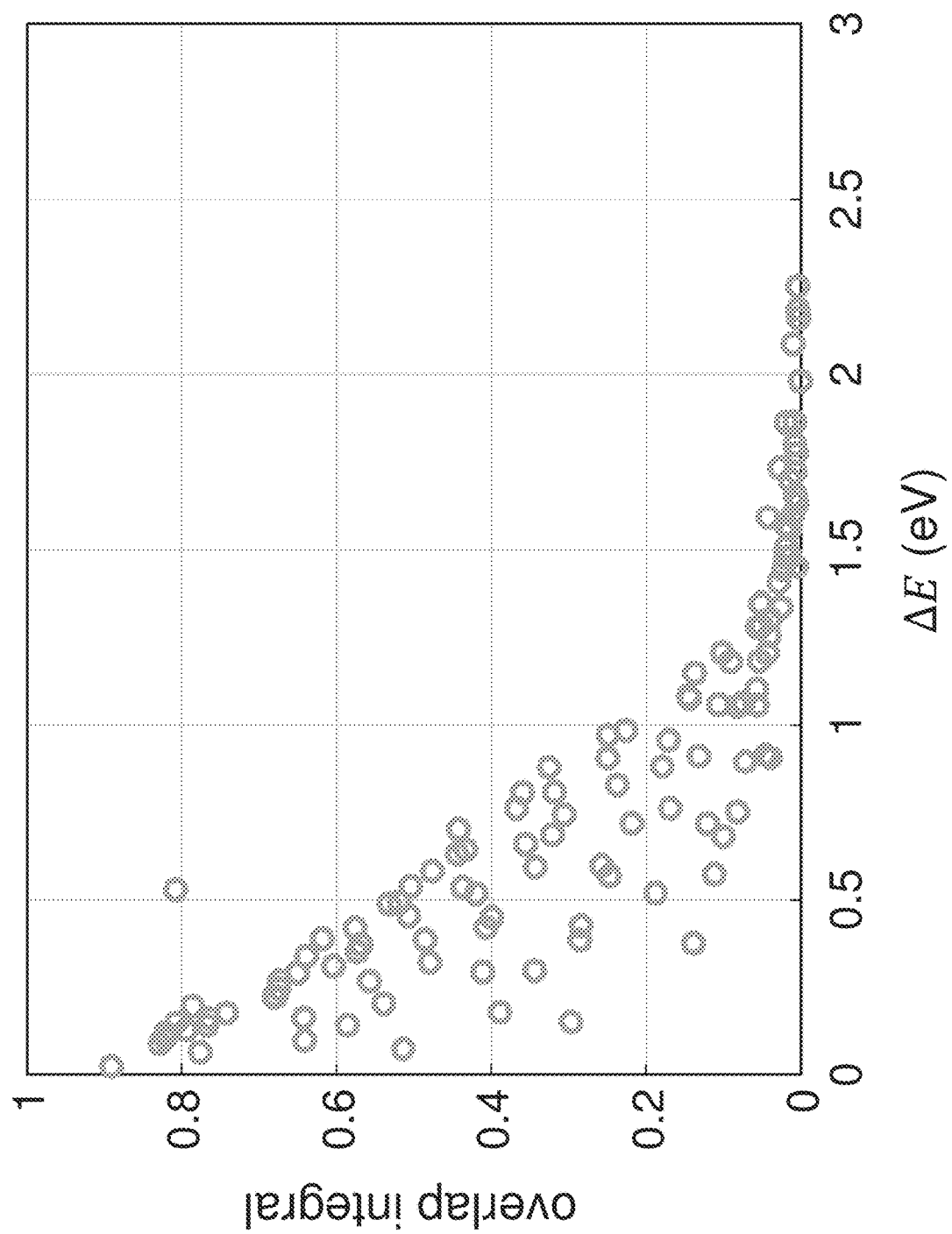
FIG. 1G is a graph of the overlap integrals between electron wavefunctions for the simulated structure shown in FIG. 1E as a function of the intersubband transition energies between the wavefunctions, in accordance with some embodiments.

FIG. 1G is a graph of the overlap integrals between electron wavefunctions for the simulated structure shown in FIG. 1E as a function of the intersubband transition energies between the wavefunctions. Each point represents a transition from one energy state to another in the conduction band, and the points are plotted according to the transition energy and overlap integral of each pair of electron wavefunctions in FIG. 1E. The electron concentration in the chirp layer is relatively low, due to an approximately 0.4 eV potential barrier at the start of the chirp layer. The electrons that overshoot the chirp layer can have an excess energy of approximately 2 eV above the energy minima at the end of the chirp layer. Given the chirp potential structure, including the relatively thin barriers (i.e., approximately 2 ML), the wavefunctions are spread out over multiple quantum wells, and some higher energy wavefunctions have a substantial overlap (e.g., above 0.2) with others at significantly lower energies (e.g., with transition energy approximately 1 eV). FIG. 1E graphically shows the wavefunctions that can be spread over many wells. As a result, electrons can travel quickly inside the chirp layer, and can, in some cases, release their extra energy in large steps (e.g., approximately 1 eV). FIG. 1G quantifies the available intersubband transition energies and shows the calculated overlap integrals between the different sets of electron wavefunctions in the conduction band. FIG. 1G shows that there are many available transitions with energies at approximately 1 eV, or greater than 1 eV, which will occur with high probability (e.g., with overlap integrals greater than approximately 0.1 or greater than approximately 0.05) in this structure. FIG. 1G shows that the electron relaxation is relatively likely to occur (e.g., overlap integral greater than 0.05) in steps that are even greater than 1.2 eV.

Figure 1H:
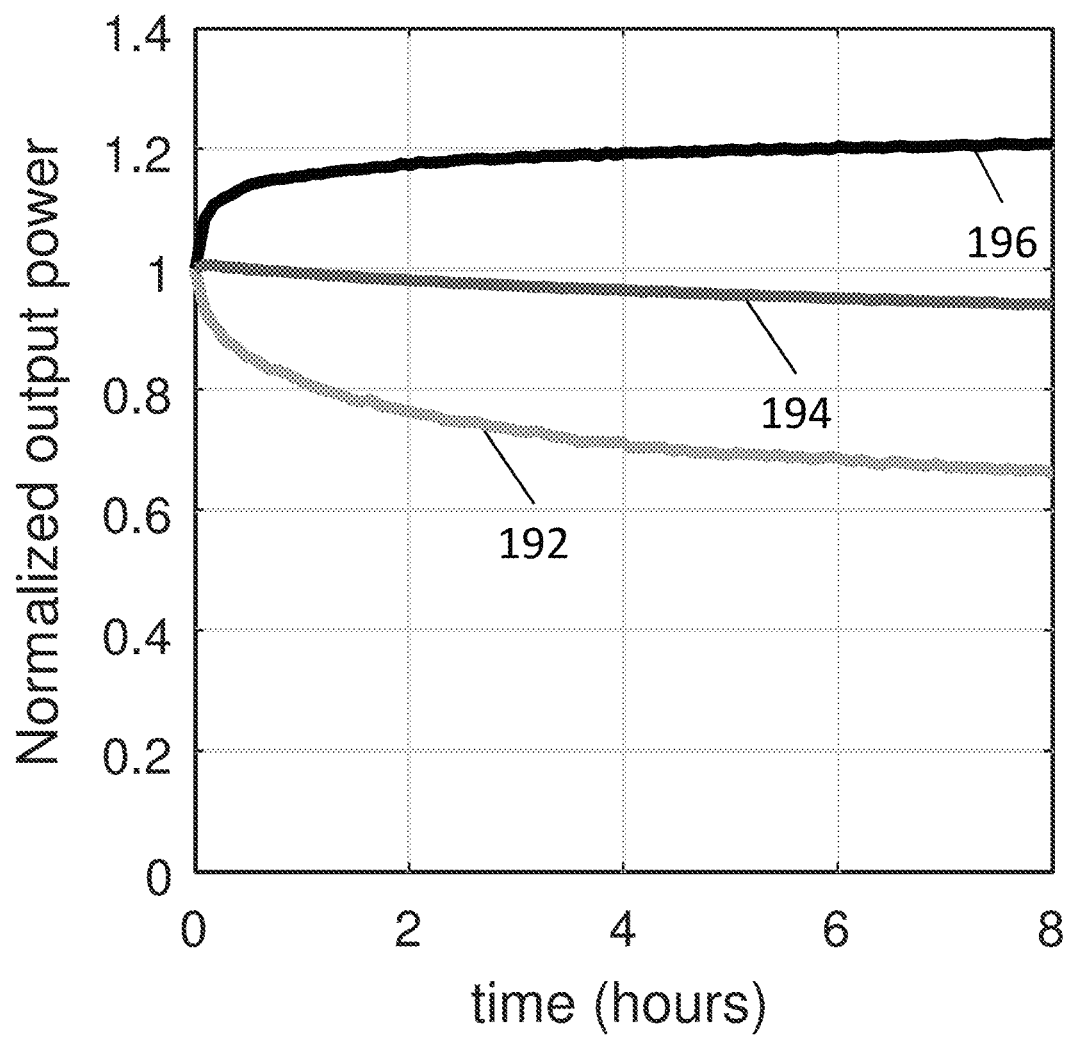
FIG. 1H is a graph of the normalized output power of a UV-C LED including a structure approximately equal to those shown in FIGS. 1E and 1F, as well as the output power of two improved devices, in accordance with some embodiments.

FIG. 1H is a graph of the normalized output power 192 of a UV-C LED including a structure approximately equal to those shown in FIGS. 1E and 1F. The output power of this device decreased by approximately 35% over approximately 8 hours. Although the device output power 192 does degrade somewhat, the amount of degradation is significantly less than the amount of degradation that would be expected from a similar device that does not incorporate the chirp layer 120 (i.e., compared to a device that contains a conventional structure similar to structure 100 in FIG. 1A). Two other device output powers 194 and 196 with improved lifetimes compared to the output power 192 are also shown in this figure and are described below. The data shown in the plot in FIG. 1H are data from experimentally produced UV-C LEDs with the structures described herein, which were grown using molecular beam epitaxy on sapphire substrates.

Figure 2A:
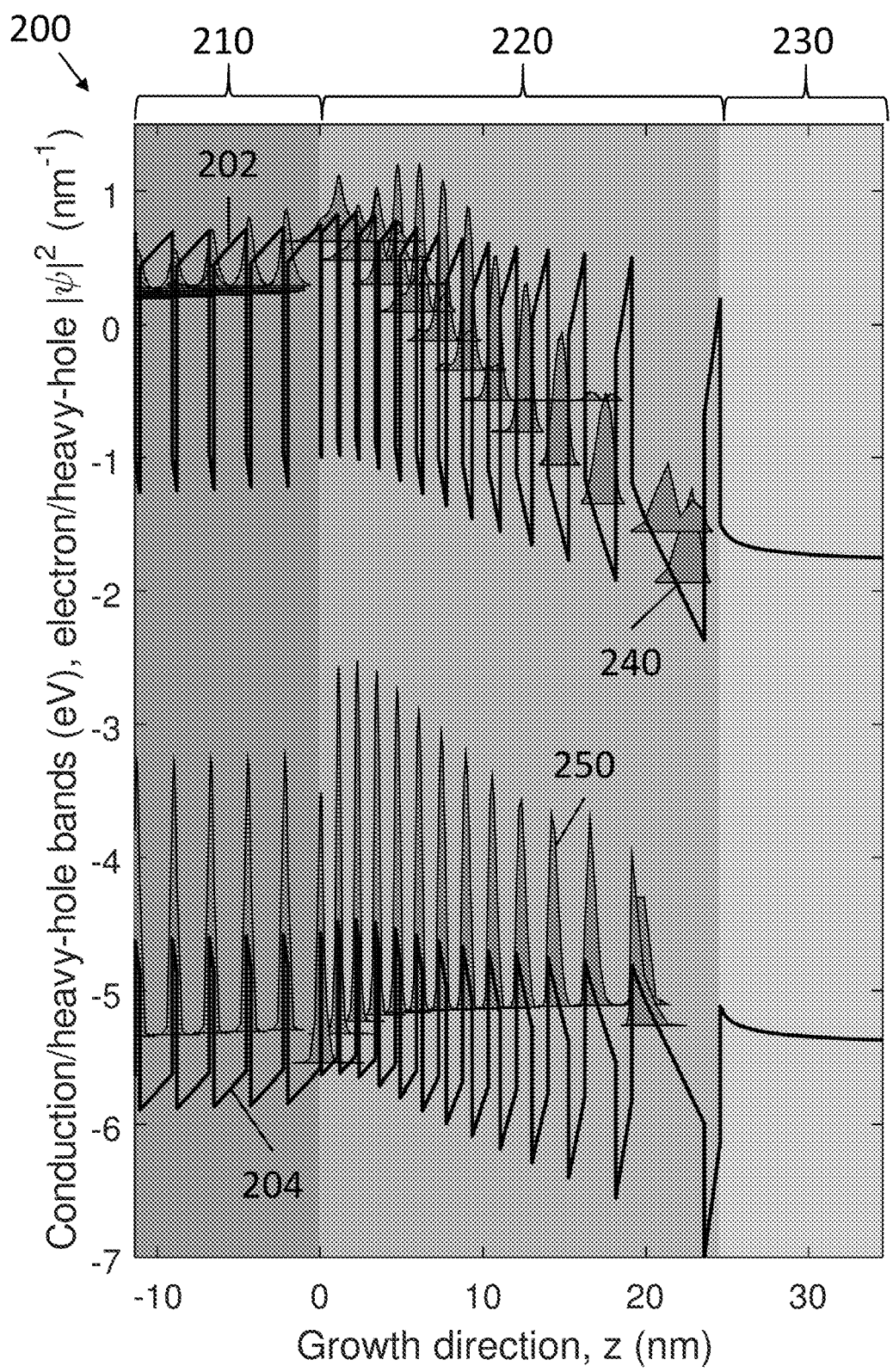
FIG. 2A shows an example of a conduction band profile and valence band profile along the growth direction (z) of a first improved semiconductor structure, in accordance with some embodiments.

FIG. 2A is an example of a conduction band 202 and valence band 204 profile 200 along the growth direction (z) of a first improved semiconductor structure (e.g., in a UV-C LED), including a plurality of first semiconductor layers 210 comprising wide bandgap semiconductor layers, a narrow bandgap layer 230, and a chirp layer 220 between layers 210 and 230. The layers 210, 220 and 230 in the structure simulated in FIG. 2A are similar to layers 110, 120 and 130 respectively, in the structure modelled in FIG. 1E. For instance, layer 210 is unintentionally doped, and can be referred to as an SPSL layer, or an i-layer, herein. In some embodiments, the chirp layers described herein (i.e., in this example, and other examples) can be chemically doped n-type or p-type, and/or polarization doped. FIG. 2A also includes simulated electron wavefunctions 240 and the hole wavefunctions 250 that are allowed within such a structure. The x- and y-axes in FIG. 2A are similar to those described in FIG. 1E, and the electron wavefunctions 240 and the hole wavefunctions 250 in FIG. 2A are plotted similarly as those in FIG. 1E (e.g., baseline of each of the wavefunctions is aligned with their energies). In the example shown in FIG. 2A, a 5.2 V voltage is applied between p- and n-contacts, equivalent to flatband. This condition is also close to the operating condition for an LED incorporating the structure modelled in FIG. 2A. The layers 210 and 220 are SPSLs similar to those in the structure in FIG. 1E, and the materials and doping used in the layers 210, 220 and 230 are the same as those in layers 110, 120 and 130 in FIG. 1E. However, the major difference between this first improved structure in FIG. 2A and the baseline structure modelled in FIG. 1E is that the barriers in the i-chirp layer in this improved device structure are thicker than those in the baseline structure. The thickness of the i-chirp layer was maintained at approximately 30 nm in this improved structure, which caused the total number of quantum wells to also be lower in this improved structure than the baseline structure in FIG. 1E. In this example of an improved device, the plurality of first semiconductor layers 210 comprising wide bandgap semiconductor layers contains alternating layers of AlN and GaN. The chirp layer 220 is unintentionally doped, and has a high hole concentration due to polarization doping. In the i-chirp layer in this example, the AlN barrier thicknesses are kept constant at approximately 4 ML (compared to 2 ML for the baseline structure), while the GaN well thickness monotonically increases, in such a way that the average aluminium content (over a unit cell) varies from 100% to 0% within approximately 30 nm.

Figure 2B:
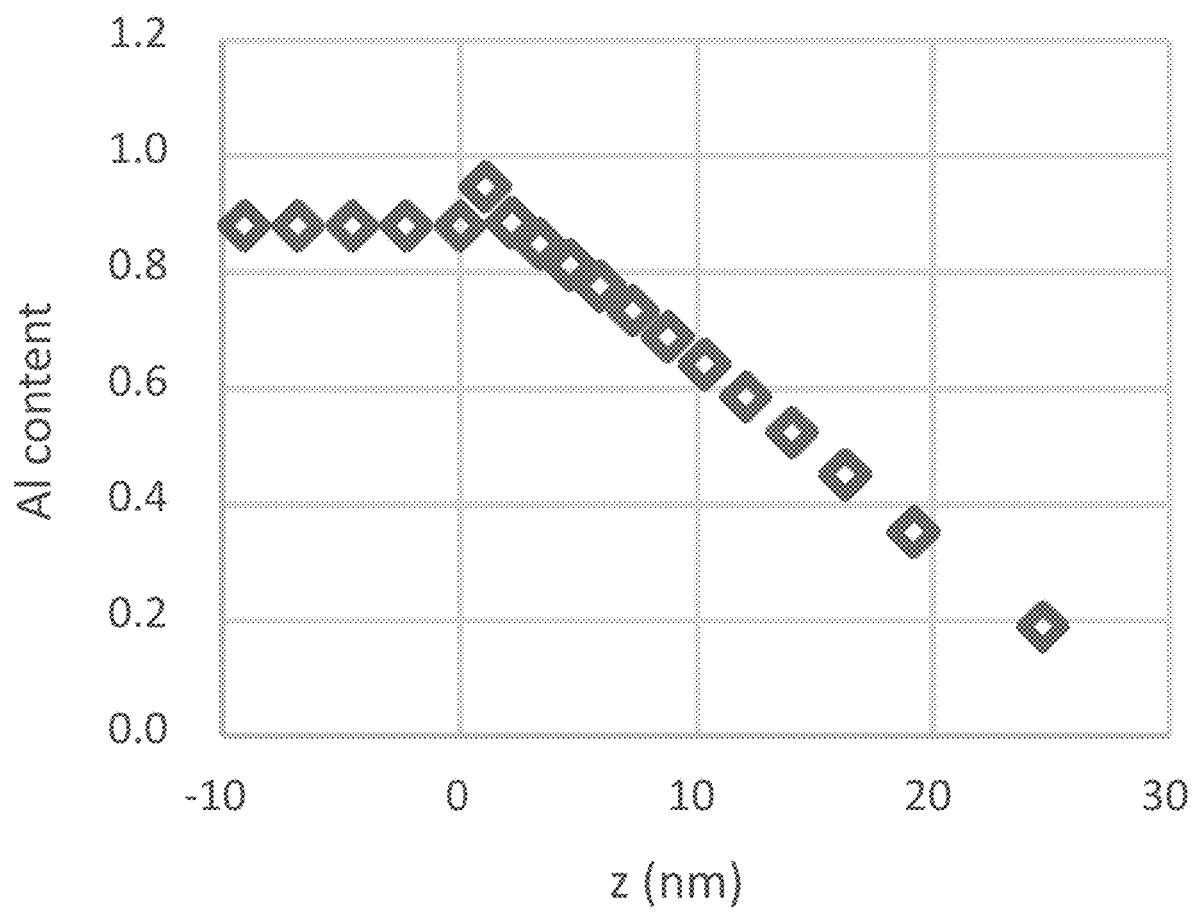
FIG. 2B is a graph showing the average composition of each of the unit cells making up part of the n-layer and the chirp layer of the semiconductor structure simulated in FIG. 2A, in accordance with some embodiments.

FIG. 2B is a graph showing the average composition of each of the unit cells making up the chirp layer 220 of the improved semiconductor structure simulated in FIG. 2A. The y-axis of the graph in FIG. 2B is the "Al content", or the composition of Al/(Al+Ga) over each pair of AlN/GaN layers in the i-chirp layer. The x-axis ("z (nm)") is the thickness along the i-chirp layer shown in FIG. 2A, where 0 nm in FIG. 2B corresponds to 0 nm in the "Growth Direction, z (nm)" in FIG. 2A. The GaN well thicknesses at the start of the i-chirp layer 220 are very thin, and the AlN barriers are approximately 4 ML, and therefore the average composition is close to 100% Al/(Al+Ga). As the GaN well thicknesses increase monotonically, the composition of Al/(Al+Ga) decreases monotonically, as shown in FIG. 2B.

In the improved structure shown in FIGS. 2A and 2B the average aluminium content in the chirp layer changes monotonically, which is similar to the baseline structure shown in FIGS. 1E and 1F. However, the barriers in the improved structure are thicker than those in the baseline structure, which results in more confined electron wavefunctions 240, as illustrated in FIG. 2A. The more confined electron wavefunctions have less overlap between wavefunctions with high energy transitions between them, as well as lower overlaps with the barrier centers throughout the chirp layer. In some embodiments, the present chirp layers (i.e., located between regions with high effective bandgaps and regions with low effective bandgaps in semiconductor devices) have barrier layer thicknesses greater than 2 ML, or greater than 4 ML, or greater than 6 ML, or from 2 ML to greater than 10 ML, or from 2 ML to 12 ML, or from 2 ML to 15 ML, or from 2 ML to 10 ML, or from 4 ML to 10 ML, or from 4 ML to 6 ML. In some embodiments, the barriers are as thick as 100 ML, however, barriers that are much thicker than 10 ML may not work in all embodiments. For example, if the barriers are AlN, then a 100 ML barrier thickness may be non-ideal because they would be too thick for carriers (e.g., electrons and holes) to tunnel through them, which would limit carrier transport through the chirp layer. In another example, however, where the barriers have a lower bandgap than that of AlN (e.g., for AlGaN barriers), then carriers are able to tunnel through thicker barriers. In some embodiments, therefore, the present chirp layers have barrier layer thicknesses greater than 20 ML, or greater than 50 ML, or from 2 ML to 20 ML, or from 2 ML to 40 ML, or from 2 ML to 50 ML, or from 2 ML to 100 ML. The term "short-period superlattice" as used herein (i.e., in reference to the chirp layer, or any other layer in the present structures), therefore, also includes superlattices with layers as thick as 100 ML.

Figure 2C:
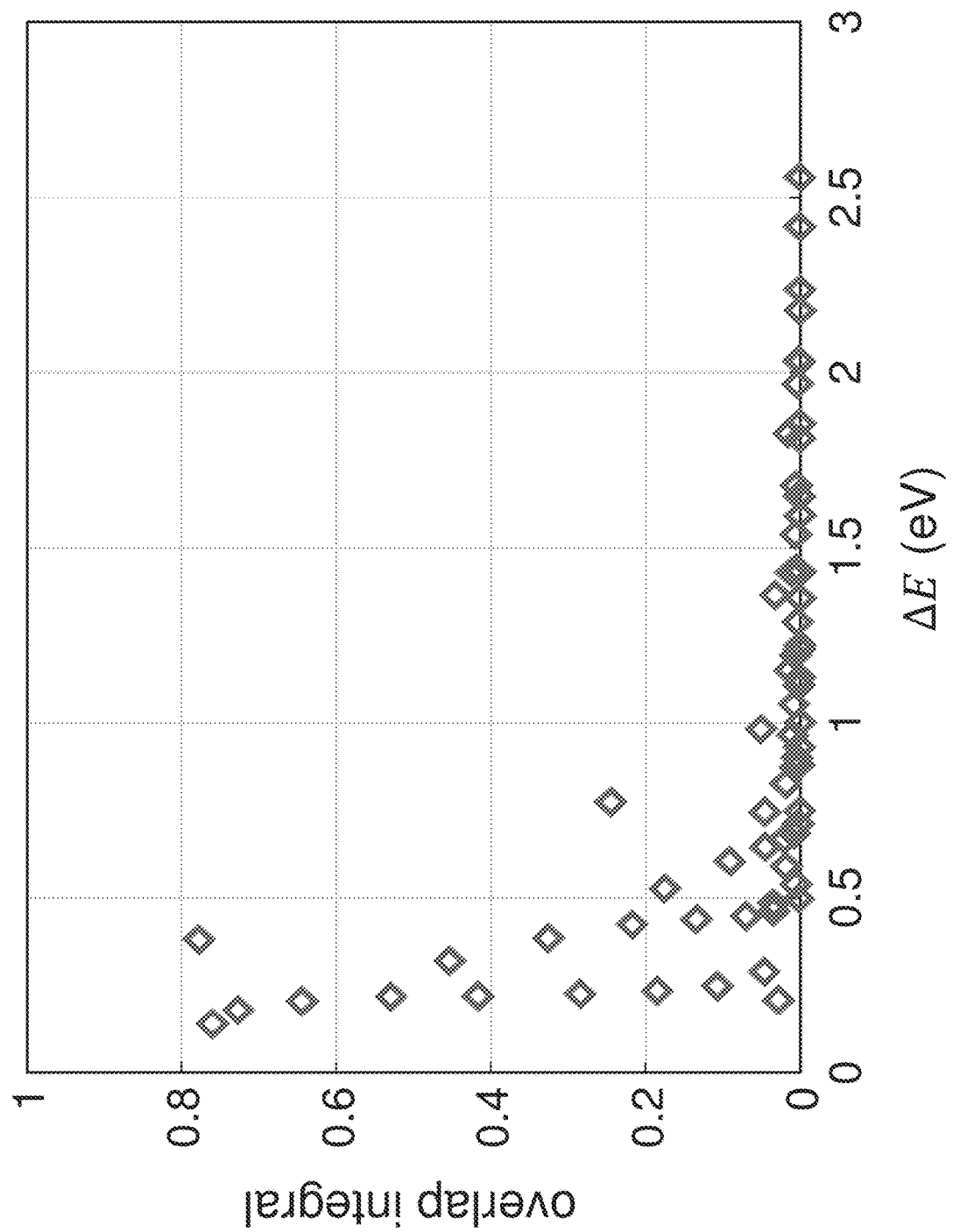
FIG. 2C is a graph of the overlap integrals between electron wavefunctions for the simulated structure shown in FIG. 2A as a function of the intersubband transition energies between the wavefunctions, in accordance with some embodiments.

FIG. 2C is a graph of the overlap integrals between electron wavefunctions for the simulated structure shown in FIG. 2A as a function of the intersubband transition energies between the wavefunctions. Each point represents a transition from one energy state to another in the conduction band, and the points are plotted according to the transition energy and overlap integral of each pair of electron wavefunctions in FIG. 2A. The improved chirp potential structure, including the thicker barriers (i.e., approximately 4 ML) and fewer wells, limits the wavefunction spreading in the chirp layer 220. FIG. 2A graphically shows that the wavefunctions are spread over fewer quantum wells than those in the baseline structure modelled in FIG. 1E. As a result, the higher energy wavefunctions have smaller overlaps (e.g., less than 0.05) with other wavefunctions at significantly lower energies (e.g., with transition energy approximately 1 eV). FIG. 2C quantifies the available intersubband transition energies in this improved structure and shows the calculated overlap integrals between the different sets of electron wavefunctions in the conduction band. FIG. 2C shows that all of the high probability available transitions with energies greater than 1 eV have been eliminated in this improved structure. Given the smaller wavefunction spreading, the overshot electrons must go through smaller energy relaxation events as they move through the chirp layer in this improved device structure. Indeed, as shown in FIG. 2C, the available intersubband transition energy steps with moderately high probability of occurring (e.g., with overlap integral greater than 0.05) are limited to less than 0.8 eV.

Referring back to FIG. 1H, the graph of the normalized output power 194 of a UV-C LED incorporating an improved structure similar to those shown in FIGS. 2A and 2B decreased by approximately 6% over approximately 8 hours. The lifetime of this example improved device has therefore improved by approximately 700% (or from approximately 500% to approximately 1000%) compared to the baseline device power output 192.

Not to be limited by theory, the improved lifetime of the improved UV-C LED structure described in FIGS. 2A-2C could have been due to the lack of available high energy intersubband transitions within the conduction band of the i-chirp layer. Electrons moving through the i-chirp layer can lose energy due to intersubband transitions within the conduction band. The energy lost by the electrons in these transitions can be absorbed by defects (e.g., interstitials or vacancies), which can mobilize the defects. In some cases, the defects will tend to move towards the point of highest tensile strain, which in some cases is in the i-SPSL and/or i-chirp layer. As activated defects move to different regions of the device (e.g., an active layer, or a light emission layer), they can affect the non-radiative emission rate, which can decrease the device efficiency over time and degrade the device lifetime. Therefore, the reduction of high energy intersubband transitions, and the resulting reduction of defect mobilization, in the improved structure shown described in FIGS. 2A-2C could have been responsible for the improved device lifetime.

The defects that can be activated by the electron relaxation can form in different regions depending on the device structure. In the example AlN/GaN based structures and devices described herein, the p-type GaN layer can be a large source of defects, especially when the layer is grown nitrogen-rich. Additionally, GaN wells can be a source of defects. For example, when thin GaN wells are grown (e.g., with thickness less than 1 ML), 3-dimensional islands of GaN surrounded by AlN can form, and defects can be created around the islands. In some embodiments, therefore, it can be beneficial to design the structures with GaN wells that are thicker such that they reduce the number of islands and the concentration of point defects (e.g., in the i-chirp layer) are reduced.

In some embodiments, a layer that blocks electrons and confines them in the active layer (e.g., the i-SPSL layer) is included the present semiconductor structures. The simulated structures shown in FIGS. 1E and 2A include electron blocking layers (EBLs). Electrons moving from the SPSL 110/210 to the chip layer 120/220 (i.e., from left to right in the figures) experience a barrier, and have to move from lower energies to higher energies (as shown by the baseline, or energy, differences between the electron wavefunctions in the wells of the SPSL layer 110/210 and the leftmost well(s) in the chirp layer 120/220). In the structure shown in FIG. 1E, the EBL extends from approximately z=0 nm to approximately z=10 nm (i.e., the point where the electron wavefunction energy in the chirp layer is approximately aligned in energy with the electron wavefunction energies in the SPSL layer 110/210). In the structure shown in FIG. 2A, the EBL extends from approximately z=0 nm to approximately z=5 nm.

The chirp layer can also supply holes to the SPSL layer 110/210 via polarization doping. The unexpected results described herein, however, indicate that the chirp layer can be designed to have an additional functionality: to "gracefully" lower the energy of any stray electrons that do not recombine in the SPSL layer 110/210. Specifically, the large difference in bandgap between the active SPSL layer 110/210 and the narrow bandgap p-layer risks high energy electrons thermalizing in the p-layer or in GaN wells of the chirp. However, by employing one or more of the improved chirp features described herein (e.g., thicker AlN barriers), the stray electrons can thermalize in the chirp layer through small steps, which do not emit enough energy to significantly activate (e.g., mobilize) defects.

Figure 3A:
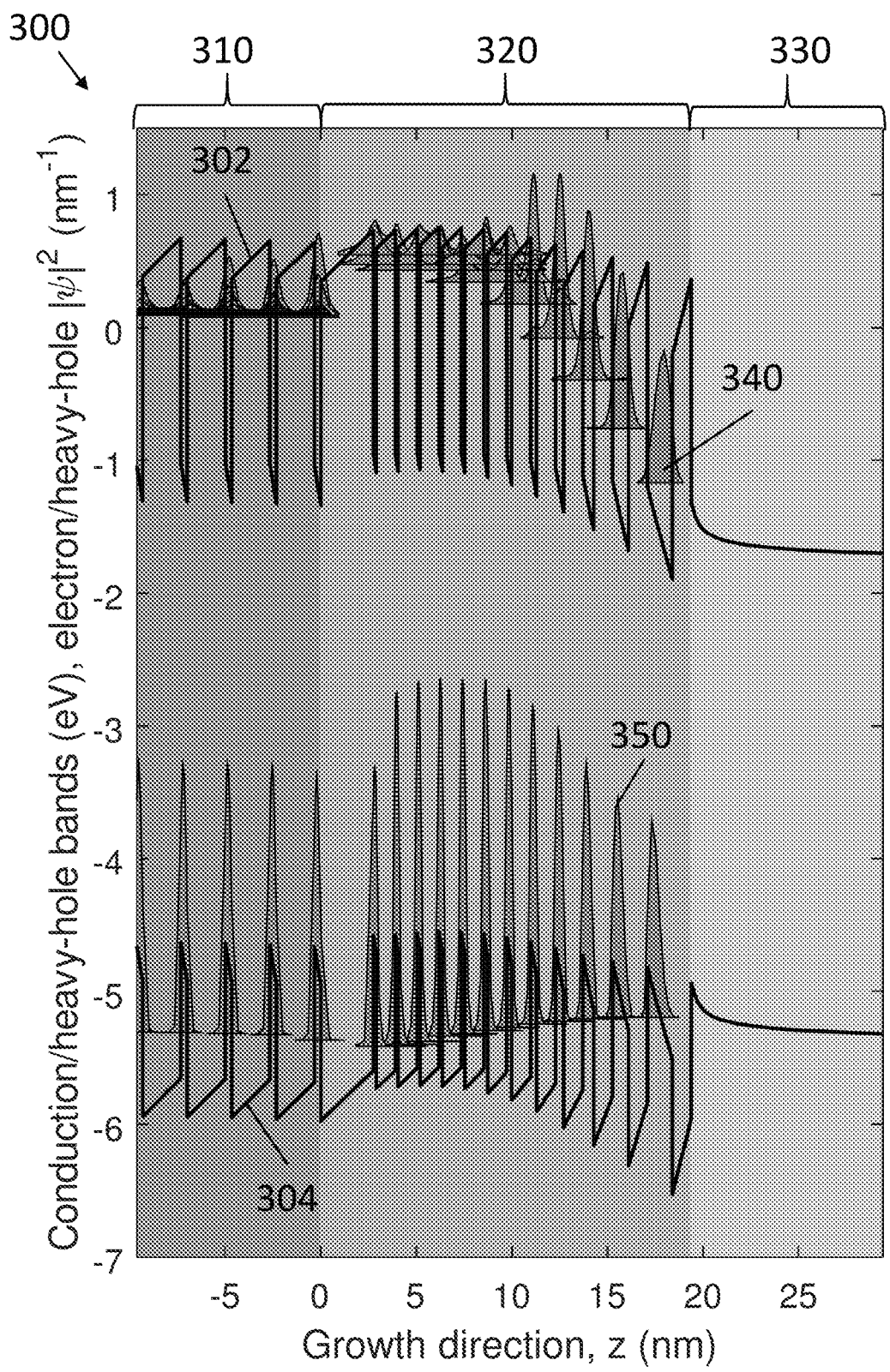
FIG. 3A shows an example of a conduction band profile and valence band profile along the growth direction (z) of a second improved semiconductor structure, in accordance with some embodiments.

FIG. 3A is a second example of an improved structure with a conduction band 302 and valence band 304 profile 300 along the growth direction (z) of a semiconductor structure (e.g., in a UV-C LED), including a plurality of first semiconductor layers 310 comprising wide bandgap semiconductor layers, a narrow bandgap layer 330, and a chirp layer 320 between layers 310 and 330. The structure in FIG. 3A also includes an electron blocking layer (EBL), which is about 10 nm thick (from approximately z=0 nm to approximately z=10 nm) and is thicker than the EBL in the first improved structure simulated in FIG. 2A. FIG. 3A also includes the electron wavefunctions 340 and the hole wavefunctions 350 that are involved in carrier transport and are allowed within such a structure. The x- and y-axes in FIG. 3A are similar to those described in FIGS. 1E and 2A, and the electron wavefunctions 340 and the hole wavefunctions 350 in FIG. 3A are plotted similarly as those in FIG. 1E (e.g., baseline of each of the wavefunctions is aligned with their energies). A 5.2 V voltage is applied between p- and n-contacts, equivalent to flatband. This condition is also close to the operating condition for an LED incorporating the structure modelled in FIG. 3A. The layers 310 and 320 are SPSLs similar to those in the structures in FIGS. 1E and 2A, and the materials and doping used in the layers 310, 320 and 330 are the same as those in layers 110, 120 and 130 FIGS. 1E and 2A. For instance, layer 310 is unintentionally doped, and can be referred to as an SPSL layer, or an i-layer, herein. In some embodiments, the chirp layers described herein (i.e., in this example, and other examples) can be chemically doped n-type or p-type, and/or polarization doped. However, the major difference between this structure and the baseline structure modelled in FIGS. 1E and 1F (and the first example of an improved structure in FIGS. 2A and 2B) is that the thickness of the quantum wells and the barriers in the chirp layer 320 in this second example of an improved device structure both change within the chirp layer 320. The chirp layer 320 in this example contains a first barrier (at z=0) that is thicker than the rest of the barriers in the chirp layer 320. Furthermore, the wells within the chirp layer in this example do not change thickness monotonically. The first well in the chirp layer 320 (at approximately z=3 nm in FIG. 3A) is slightly thicker than the adjacent well (at approximately z=4 nm in FIG. 3A), and then the remainder of the wells in the chirp layer 320 increase thickness monotonically. Table 1 shows the thickness of the wells and barriers within the chirp layer 320 in FIG. 3A, from left to right in the figure. This is an example of a chirp layer with well thicknesses that decrease and then increase, moving in the direction from the layer containing wide bandgap materials (e.g., the SPSL layer 310) to the layer containing narrow bandgap materials (e.g., the narrow bandgap layer 330). In some embodiments, the chirp layer, moving in the direction from the layer containing wide bandgap materials (e.g., the SPSL layer 310) to the layer containing narrow bandgap materials (e.g., the narrow bandgap layer 330), has well thicknesses that decrease, decrease then increase, or that decrease and then increase multiple times.

TABLE 1

Chirp layer structure simulated in FIG. 3A.

| Well thickness (ML) | Barrier thickness (ML) |
|---|---|
|  | 11 |
| 0.60 | 4 |
| 0.55 | 4 |
| 0.57 | 4 |
| 0.65 | 4 |
| 0.70 | 4 |
| 0.80 | 4 |
| 0.95 | 4 |
| 1.20 | 4 |
| 1.60 | 4 |
| 2.20 | 4 |
| 3.20 | 4 |
| 5.00 | 4 |

Figure 3B:
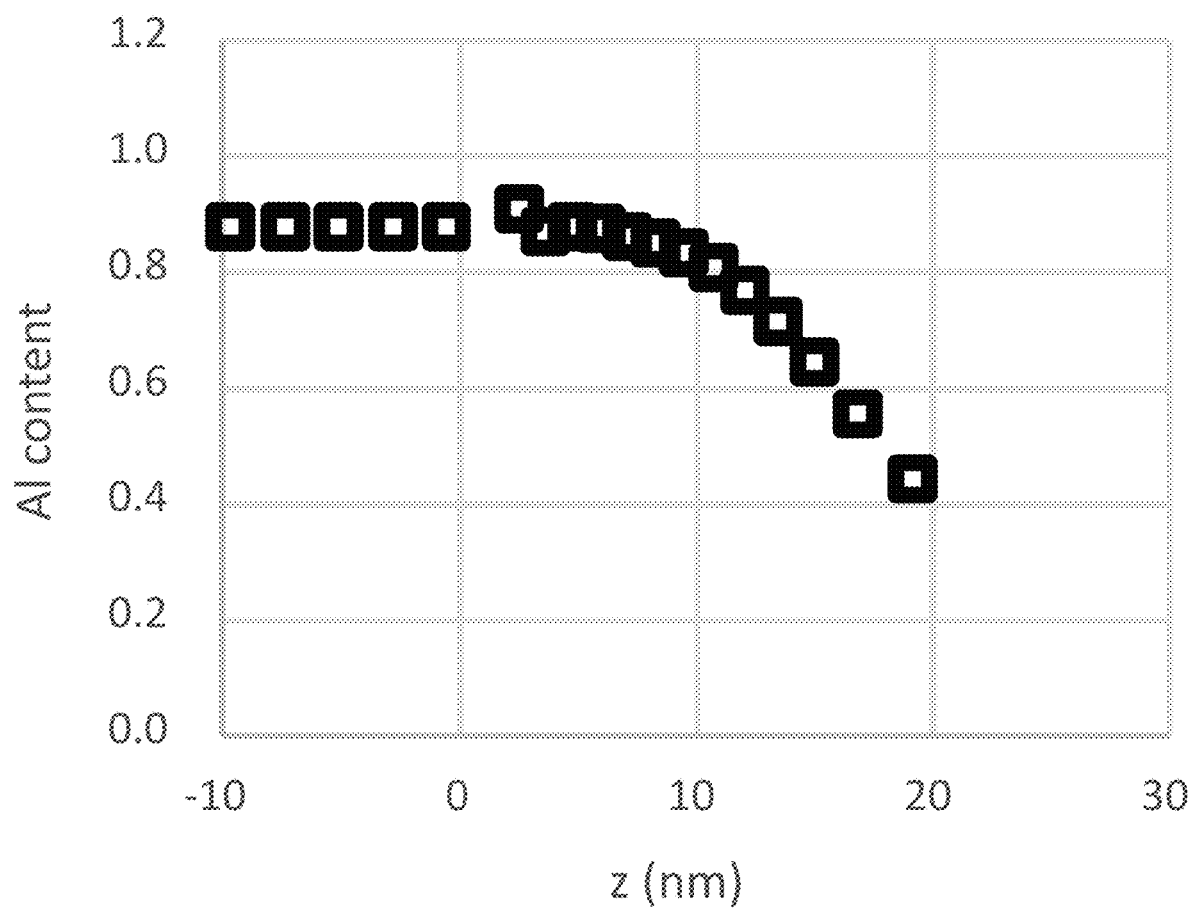
FIG. 3B is a graph showing the average composition of each of the unit cells making up part of the n-layer and the chirp layer of the semiconductor structure simulated in FIG. 3A, in accordance with some embodiments.

FIG. 3B is a graph showing the average composition of each of the unit cells making up the chirp layer 320 of the second example of an improved semiconductor structure simulated in FIG. 3A. The y-axis of the graph in FIG. 3B is the "Al content", or the composition of Al/(Al+Ga) over each pair of AlN/GaN layers in the i-chirp layer. The x-axis ("z (nm)") is the thickness along the chirp layer 320 shown in FIG. 3A, where 0 nm in FIG. 3B corresponds to 0 nm in the "Growth Direction, z (nm)" in FIG. 3A. The average composition does not vary monotonically through the whole chirp layer 320 in this example, but does vary monotonically through a large portion of the chirp layer 320. The change in the average composition of the chirp layer 320 in a region adjacent to the SPSL layer 310 also changes more slowly (excluding the effect of the first thick barrier) than it does in the baseline structure simulated in FIG. 1E or the first improved structure simulated in FIG. 2A.

Figure 3C:
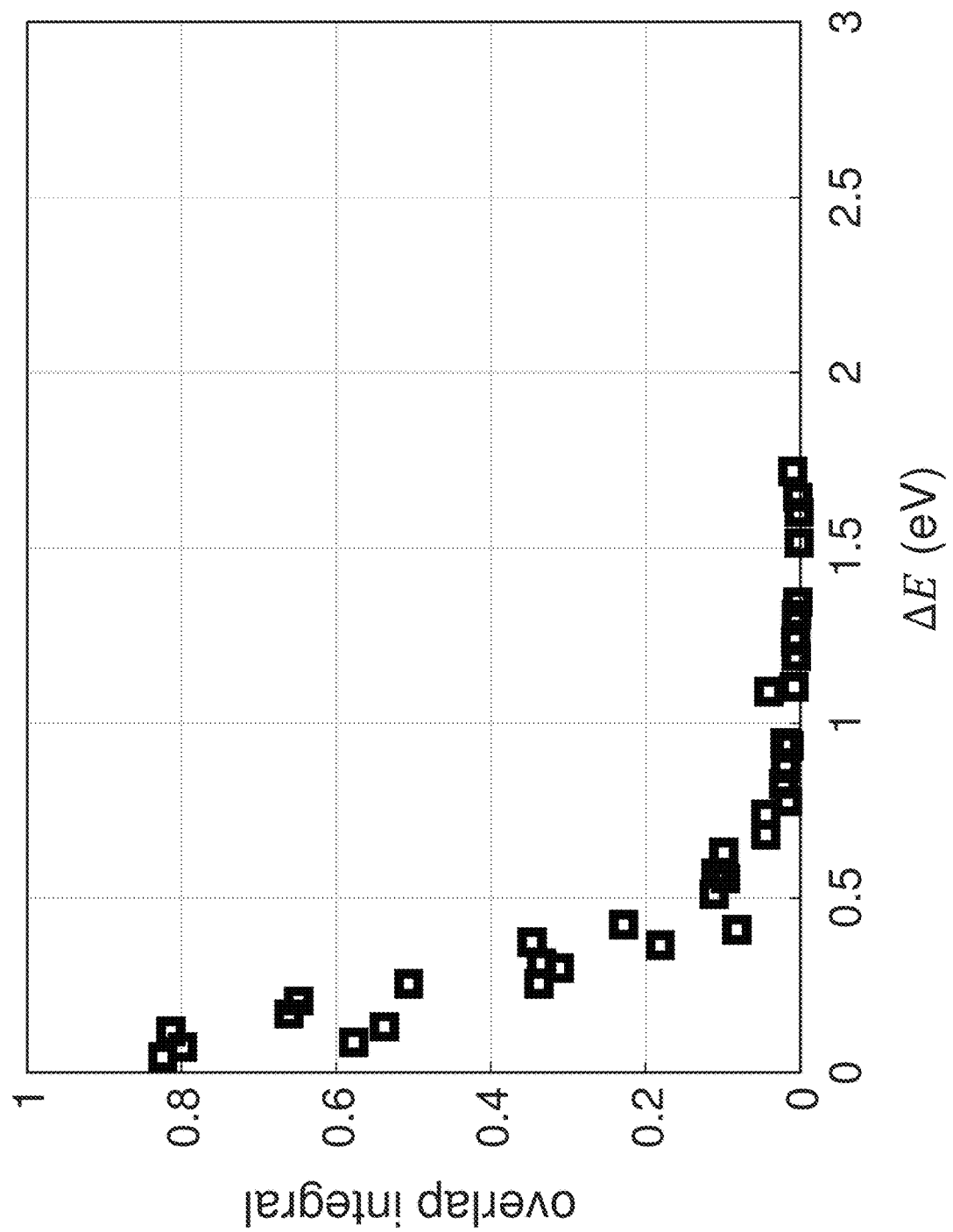
FIG. 3C is a graph of the overlap integrals between electron wavefunctions for the simulated structure shown in FIG. 3A as a function of the intersubband transition energies between the wavefunctions, in accordance with some embodiments.

FIG. 3C is a graph of the overlap integrals between electron wavefunctions for the simulated structure shown in FIG. 3A as a function of the intersubband transition energies between the wavefunctions. FIG. 3C illustrates that the second example of an improved chirp potential structure limits the number of high probability high energy transitions. The barriers of the chirp layer are thicker than those in the baseline structure, and as a result some of the electron wavefunctions experience less spreading in this improved structure, similar to the first improved structure modelled in FIG. 2A. However, this structure also has other advantages over the first improved structure. The EBL region is wider, which helps keep electrons in the SPSL layer 310 (e.g., where they can radiatively recombine with holes) and not overshoot into the chirp layer 320 where they can generate losses and also cause damage that can impact the lifetime of device incorporating such a structure. Even though the number of high energy transitions with high transition probabilities was greatly reduced from the baseline structure to the first improved structure, the design of the chirp layer in the second improved structure modelling in FIG. 3A contains even fewer higher energy transitions with higher transition probabilities than the first improved structure. FIG. 3A also illustrates that this chirp layer 320 design improves the hole transport, which is evident from the reduced barrier for holes travelling from the chirp layer 320 to the SPSL layer 310 in the second improved structure, compared to the first improved structure, which contains a barrier for holes in the wells in the chirp layer 220 adjacent to the SPSL layer 210 (i.e., the hole wavefunctions in that region have lower energies than the SPSL hole wavefuctions). FIG. 3C quantifies the available intersubband transition energies in this second example of an improved structure and shows the calculated overlap integrals between the different electron wavefunctions in the conduction band, similar to FIGS. 1G and 2C. FIG. 3C shows that all of the high probability available transitions with energies greater than 1 eV have been eliminated in this second example of an improved structure. The available intersubband transition energy steps with moderately high probability of occurring (e.g., with overlap integral greater than 0.05) are limited to less than about 0.8 eV, and the available intersubband transition energy steps with overlap integral greater than 0.2 are limited to less than about 0.5 eV in this example.

Referring back to FIG. 1H, the graph of the normalized output power 196 of the UV-C LED with the improved structure approximately equal to those shown in FIGS. 3A and 3B actually increased by approximately 20% and shows no apparent sign of degradation over approximately 8 hours, which is a large improvement over the baseline device (whose lifetime data is shown in 192 in FIG. 1H).

Figure 4A:
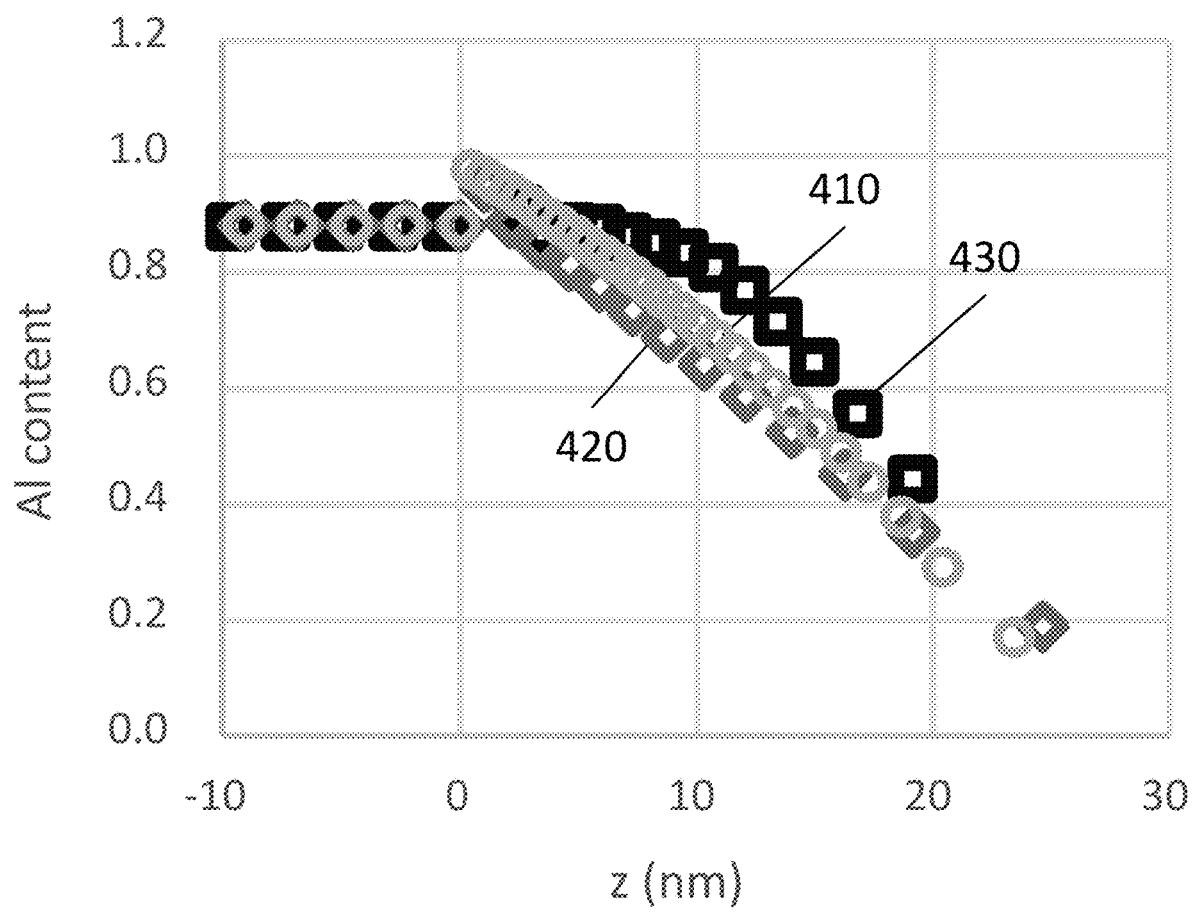
FIG. 4A is a plot overlaying the Al content for the simulated structures shown in FIGS. 1E, 2A and 3A, respectively, in accordance with some embodiments.

FIG. 4A is a plot overlaying the Al content 410, 420 and 430 for the simulated structures shown in FIGS. 1E, 2A and 3A, respectively. FIG. 4A illustrates that the Al content 420 of the first improved structure (shown in FIG. 2A) is similar to the Al content profile 410 within the chirp layer as the baseline structure, both of which are approximately linear. However, as described above the improved structure (modelled in FIG. 2A) has thicker barriers within the chirp layer than the baseline structure (modelled in FIG. 1E), which limits the overlap between the electron wavefunctions and improves the device lifetime. FIG. 4A illustrates that the Al content 430 in the chirp layer of the second improved structure departs from the Al content 410 or the Al content 420. The Al content 430 in the chirp layer of the second improved structure has been designed to limit the overlap between electron wavefunctions in the conduction band even further than in the first improved structure. As described above, the rate of change of the Al content 430 at the start of the chirp layer (i.e., close to the plurality of first semiconductor layers 310, for example in the region x from 0 nm to about 10 nm) in the second improved structure is lower than that of the Al content 410 and 420 in the other two modelled example structures.

In some embodiments, the chirp layers in the present semiconductor structures can include the wide bandgap barrier layers (e.g., AlN) with thicknesses greater than 2 ML, or greater than 4 ML, or greater than 6 ML, or from 2 ML to greater than 10 ML, or from 2 ML to 12 ML, or from 2 ML to 15 ML, or from 2 ML to 10 ML, or from 4 ML to 10 ML, or from 4 ML to 6 ML, and narrow bandgap well layers (e.g., GaN) with thicknesses that are varied from less than one ML in a region nearest the unintentionally doped short-period superlattice layer to greater than 10 ML (or to 12 ML, or to 15 ML) in a region nearest the p-type narrow bandgap layer. Furthermore, the wide bandgap layers in the chirp layer can have thicknesses that are varied from greater than 10 ML (or from 12 ML, or from 15 ML) in a region nearest the unintentionally doped short-period superlattice layer to less than 1 ML in a region nearest the p-type narrow bandgap layer.

Figure 4B:
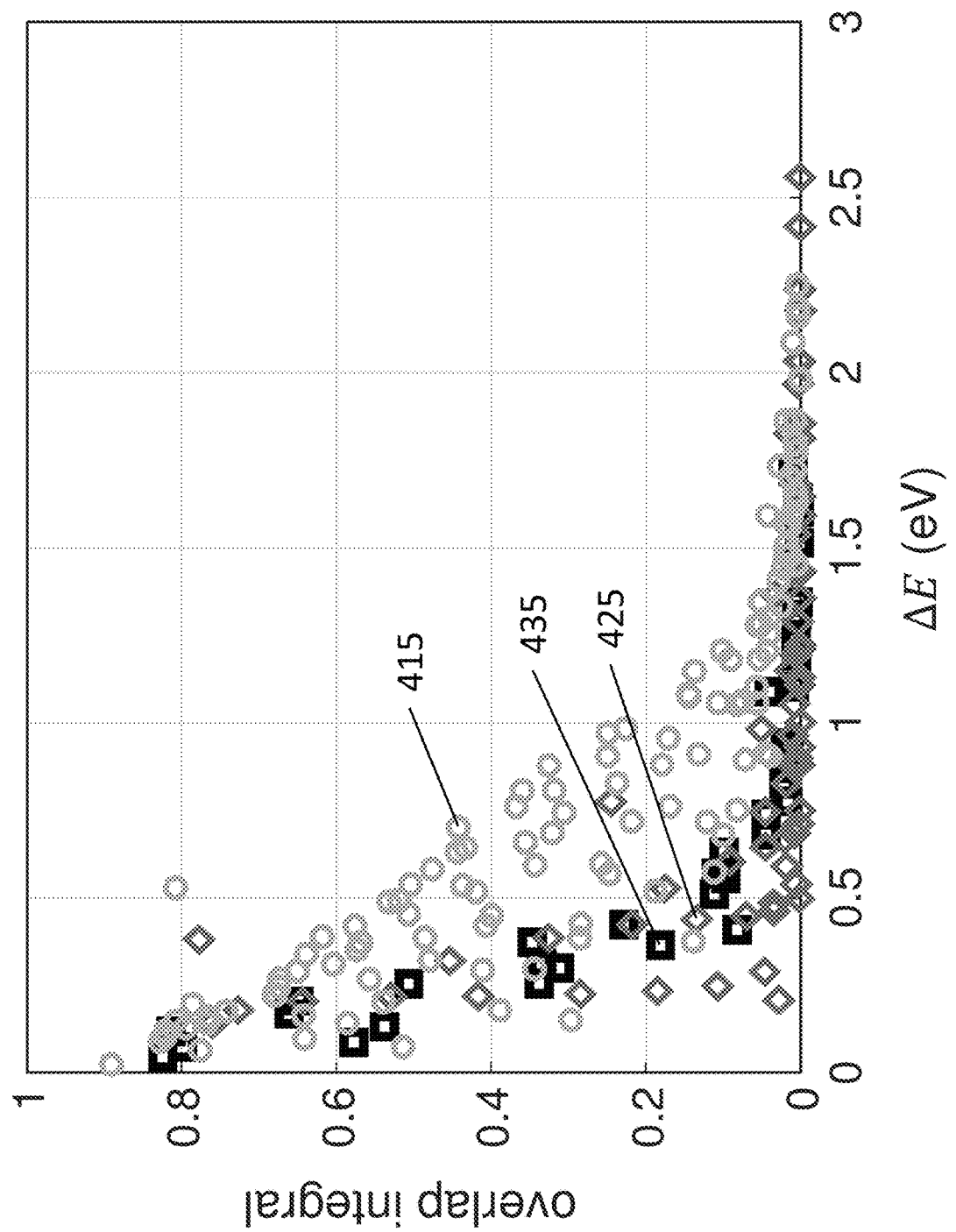
FIG. 4B is a plot overlaying the results of the overlap integrals between electron wavefunctions for the simulated structures shown in FIGS. 1E, 2A and 3A, respectively, in accordance with some embodiments.

FIG. 4B is a plot overlaying the results of the overlap integrals 415, 425, and 435 between electron wavefunctions for the simulated structures shown in FIGS. 1E, 2A and 3A, respectively. The plot in FIG. 4B shows that only the baseline structure has intersubband transitions with overlap integrals greater than about 0.05 that can occur at energies greater than 0.8 eV. The plot in FIG. 4B also shows that only the baseline structure has intersubband transitions with overlap integrals greater than about 0.02 that can occur at energies greater than 1.0 eV. The plot also shows that the improved structures shown in FIGS. 2A and 3A have fewer intersubband transitions 425 and 435 that are possible from 0.4 eV to 0.8 eV, compared to the intersubband transitions 415 of the baseline structure modelled in FIG. 1E. This plot also shows that the second improved structure has fewer higher energy transitions with higher transition probabilities than the first improved structure, which may be able to partially explain the improved device lifetime for UV-C LEDs incorporating the second improved structure (shown in FIG. 1H).

Not to be limited by theory, hot electrons can release high energy packages that excite (e.g., mobilize) defects, which cause device modifications and reduce device lifetime. Some possible device modifications include strain modifications, defect propagation, and an increase in the number of defects in the recombination zone. In some cases, these modifications occur predominantly at the end of the chirp layer nearest or within the narrow bandgap layer (e.g., the p-GaN layer 130/230/330). The layers in these regions of the device can have a high number of defects given their high strain condition and the presence of dopants.

Not to be limited by theory, a few mechanisms can explain how these defect excitations might reduce the light output power over time, which yields short lifetime performance. In some embodiments, radiative recombination occurs between the i-SPSL layer and the chirp layer. This can be the case when the chirp layer starts with a high aluminium content (as for the example devices described herein), which attracts a high hole concentration but limits hole propagation into the chirp layer, due to the built-in polarization field. Hot electrons are unlikely to cause defect migration and/or diffusion into the radiative recombination zone, because the electrons are not hot enough at the start of the chirp. However, non-radiative recombination via, for example Shockley-Read-Hall events (SRH), is highly-energetic (approximately a few eV) and therefore can also lead to defect excitation. As SRH happens everywhere that there is electron-hole overlap, this could move defects all the way into the i-layer (e.g., the SPSL layer 110/210/310), which would reduce radiative recombination. A solution to avoid such defect transport is to simply use thick aluminium barriers throughout the intrinsic layers (e.g., an active layer and/or SPSL layer) and/or the chirp layer. The rationale behind that is that, the thicker the barrier, the smaller the overlap of electrons and holes with its center.

Figure 5:
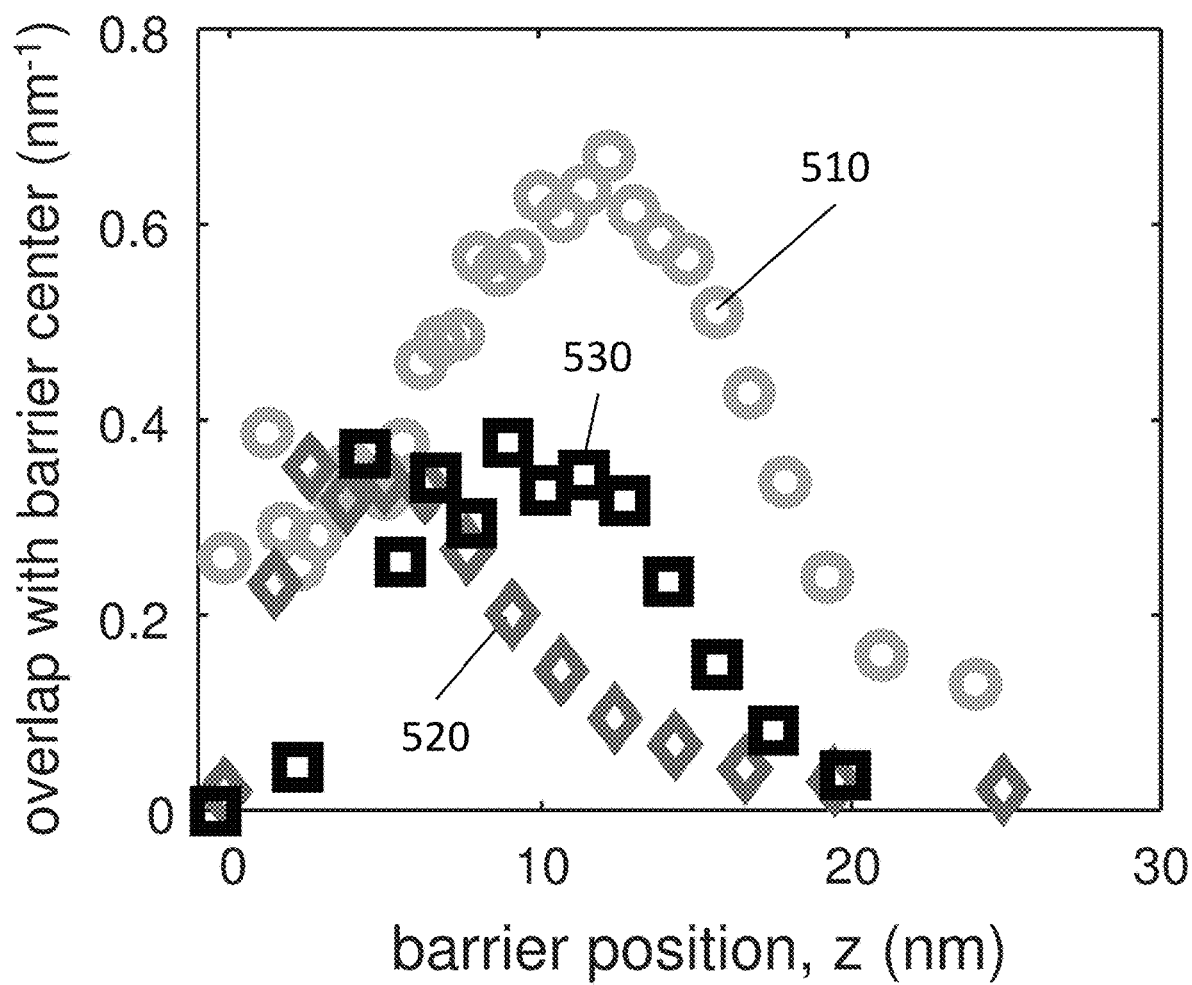
FIG. 5 is a plot showing the overlap between the electron wavefunctions and the barrier centers within the conduction band of the i-chirp layer, for the simulated structures shown in FIGS. 1E, 2A and 3A, respectively, in accordance with some embodiments.

FIG. 5 is a plot showing the overlap between the electron wavefunctions and the barrier centers within the conduction band of the i-chirp layer 510, 520 and 530, for the simulated structures shown in FIGS. 1E, 2A and 3A, respectively. The data plotted in FIG. 5, shows that the thicker 4 ML AlN barriers in the chirp layer of the first and second improved structures (shown in FIGS. 2A and 3A) have lower electron penetration into the barriers than the baseline structure with 2 ML thick AlN barriers in the chirp layer. The y-axis in the plot in FIG. 5 is the overlap with barrier center, or the magnitude of the electron wavefunctions at a given barrier center location in the chirp layer (with units $nm^{-1}$). The x-axis in the plot in FIG. 5 corresponds to the location of the barrier center in the "Growth Direction, z(nm)", as shown in the structures modelled in FIGS. 1E, 2A and 3A. The thick barriers in the improved structures cause the electron wavefunctions to have a low probability at the barrier center compared to the baseline structure. The overlaps between the electron wavefunctions and the barrier centers 520 and 530 within the conduction band of the i-chirp layer of the improved structures are small (e.g., less than 0.4), compared to the overlaps 510 of the baseline structure. Therefore, once defects migrate into a thick barrier center, it is more likely that they will be frozen out in the improved structures compared to the baseline structure. The improved structures shown in FIGS. 2A and 3A have thicker AlN barriers (throughout the structures and also close to the SPSL layers 210 and 310) and, therefore, are more efficient in preventing defects from migrating through the chirp layer and entering the radiative recombination zone. Furthermore, the electron wavefunction overlap 530 of the second improved structure is lower near z=0 than that of the electron wavefunction overlap 520 of the first improved structure, which helps blocking defect migration into the adjacent layer even further.

Not to be limited by theory, another possible mechanism for output power degradation in LEDs with structures similar to that shown in FIG. 1E is that the hole density in the radiative recombination zone depletes over time. Indeed, as hot electrons cause defects to migrate into the chirp layer, SRH recombination could increase over time in the chirp layer. That SHR recombination would consume holes before they reach the i-layer (e.g., i-SPSL layer), which therefore would reduce the density of holes in the i-layer and reduce the LED output power. In contrast, the improved chirp structures (e.g., shown in FIGS. 2A and 3A) that enable hot electron thermalization via small steps inhibit this degradation mechanism, since an increase in SRH over time is less likely to occur. Also, the thicker barriers in the chirp would help by de-activating moving defects (e.g., by freezing them in the barrier centers) and preventing an increase in the SRH recombination rate in the chirp layer. In some embodiments, given defect de-activation behaviour, thick barriers could even lead to an output improvement over time, which is observed in some experimental devices with structures similar to those in FIGS. 2A and 3A. For example, the device data 196 in FIG. 1H shows an output improvement over time, which may partially be explained by such mechanisms.

In some embodiments, further improved chirp structures can improve lifetime performance of semiconductor devices such as UV-LEDs even further. These further improved chirp structures can be used in any LED (or other semiconductor device) where an intrinsic region (or active region) lies between materials with different bandgaps (e.g. where the intrinsic region is between a layer or plurality of layers containing high bandgap materials and a narrow bandgap layer). Such further improved chirp structures are designed to prevent high energy from being released by hot electrons, and therefore limit structure modifications under operation that could lead to a poor lifetime performance. In some embodiments, a further improved chirp layer design is based on two main features: 1) thick barriers, and 2) adjacent quantum wells with non-resonant electron energy levels, at a device bias point corresponding to its desired operation condition (e.g., at or close to flatband conditions).

Firstly, as discussed above, and not to be limited by theory, thick barriers in such chirp layers can improve device performance for multiple possible reasons. Thick barriers can avoid wavefunction spreading, and therefore minimize high energy jumps which can lead to defect excitation. Thick barriers can also work as a defect propagation barrier, given the small electron and hole penetration into thick barriers. However, these barriers cannot be too thick or they will compromise hole transport.

Secondly, adjacent quantum wells within such chirp layers with non-resonant electron energy levels allow for energy to be relaxed in small steps, rather than large steps which can more efficiently excite defects. As an example, an optimized chirp can have constant AlN barrier thicknesses of 4 ML, or 6 ML, or 8 ML (approximately 0.5 nm to 2 nm) and monotonically increasing GaN wells. The exact thickness of each well can be guided by the following principle: due to the graded overall aluminium concentration, the chirp has a high hole concentration due to polarization doping. In this process, the hole states in the valence band lie within an approximately flat energy band (at flatband operation) throughout the whole chirp. Therefore, to avoid resonant electron energy levels (and limit wavefunction spreading between wells) and allow for energy to be relaxed in small steps rather than large steps, the width of subsequent wells is such that the energy difference between each electron state and the hole ground state is not resonant between each well.

Methods will now be discussed for designing chirp layers within any LED (or other semiconductor device) where an intrinsic region (or active region) lies between materials with different bandgaps (e.g. where the intrinsic region is between a layer or plurality of layers containing high bandgap materials and a narrow bandgap layer).

An optimized band-gap transition structure recipe will depend strongly on the material it is constituted of and the purpose it serves. For example, in the case of AlGaN LEDs, chirped superlattices are built with a graded total aluminium composition, with the dual purpose of bringing holes into the recombination zone (usually intrinsic, or unintentionally doped, henceforth called i-layer) and avoiding electron overshoot into the low-bandgap p-region. Devices containing other materials systems that contain an intrinsic region (or active region) between materials with different bandgaps can also benefit from the structures and methods described herein. In those cases, the chirp layers contain unit cells containing a barrier composed of a high bandgap material and a quantum well composed of a low bandgap material and can have similar structures as shown in FIGS. 2A and 3A, with materials other than AlGaN (e.g., InAlGaN, AlGaAs, or MgZnO). In some cases, the chirp layers contain unit cells containing a barrier composed of a high bandgap piezoelectric (or polarizable) material and a quantum well composed of a low bandgap piezoelectric (or polarizable) material.

Continuing with the non-limiting example of AlGaN devices, being a piezoelectric material, a graded AlN composition generates a built-in polarization field that is responsible for moving carriers within the device layers. If the graded composition layer is grown metal-polar and the chirp layer lies between the i-layer (containing higher bandgap materials) and the lower bandgap p-(Al)GaN layer, the resulting polarization field will bring holes into the i-layer even without any voltage applied to the device. Such a phenomenon is related to polarization doping, and is sometimes used in UV-C LED structures. The graded layer can also include a higher AlN content layer (compared to the i-layer) adjacent to the i-layer, such that electrons are somewhat blocked from overshooting into the low bandgap region. This EBL improves LED efficiency by confining carriers into an active region, which improves optical recombination efficiency. It also improves device lifetime by avoiding damage from hot electrons. Yet, it is impossible to completely block electrons and therefore their excess energy has to be properly thermalized.

An optimized chirp layer between a region containing high bandgap materials and a region containing low bandgap materials can be designed using the following procedure:

1) Start with a structure (e.g., similar to that shown in FIG. 1E) that:

1i) has an overall graded AlN content to facilitate hole transport according to the condition described above;

1ii) starts with a bandgap that presents a barrier for electron overshoot.

2) From this initial structure, perform an iterative process where the thickness and composition of each layer within the chirp is slightly modified. The effect of such a small device modification into device performance is a factor of many parameters, including local quantum confinement and local electric fields due to a difference in neighboring crystal structures. Therefore, the outcome can be evaluated using a broad simulation tool that includes polarization effects and quantum transport. After such a simulation is carried out, the small modification is deemed effective if:

2i) hole transport is improved through smooth valence band sequential states. More specifically, the hole wavefunctions in the valence band are as aligned as possible, in a given bias condition corresponding to device operation, to avoid barriers that can block hole transport;

2ii) electrons are effectively blocked by a high energy barrier layer at the start of the chirp layer;

2iii) overshooting electrons are efficiently thermalized, and their transport through the chirp layer is only possible by giving away energy in small energy steps.

3) If an improvement is achieved according to one or more of the criteria above, do another modification to the chirp structure and repeat process 2-2iii above. Such an iterative loop can be done as many times as desired, until a satisfactory structure is achieved (e.g., a structure similar to that shown in FIG. 3A).

Figure 6A:
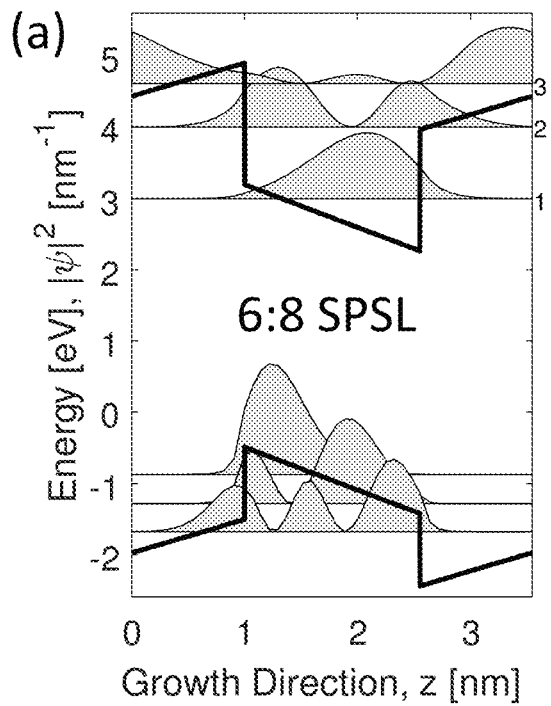
FIGS. 6A-6B show non-limiting example band diagrams for barrier/well structures, and the associated electron and hole wavefunctions, in accordance with some embodiments.
Figure 6B:
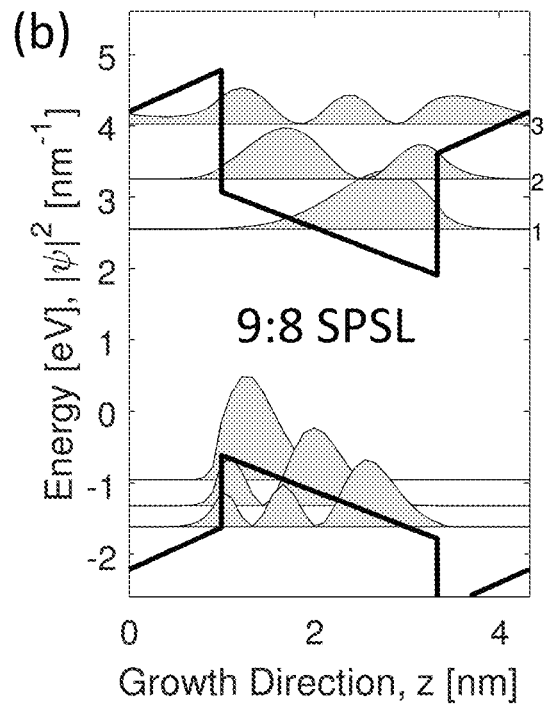

FIGS. 6A-6B show non-limiting example band diagrams for barrier/well structures, and the associated electron and hole wavefunctions. Take, for example, a 6:8 SPSL cell (i.e., the unit cell of a periodic structure with 6 ML wells and 8 ML barriers), as shown in FIG. 6A. There is roughly 1 eV energy difference between the first two electron states in the conduction band. If one chirp well has 6 MLs, the subsequent well should have a thickness such that its electron ground state lies a few 100 meV below that 6 GaN well ground state, and the excited state should lie within the 6 GaN well $1^{st}$ and $2^{nd}$ states, ideally a few 100 meV above the $1^{st}$ state to avoid thermal excitation. This could be done by, for example, having a 9 ML subsequent well. FIG. 6B shows a 9:8 SPSL (i.e., the unit cell of a periodic structure with 9 ML wells and 8 ML barriers). As FIG. 6B shows, the electron ground state for the 9:8 SPSL well lies approximately 350 meV below the 6:8 GaN well ground states shown in FIG. 6A (assuming the hole ground states have same energy). Moreover, in the 9:8 GaN well, the second electron state lies approximately 330 meV above the 6:8 GaN well ground state. Therefore, if these wells are adjacent to one another in an SPSL, as hot electrons move from the 6:8 GaN well to the 9:8 GaN well, they cannot occupy the excited state, as there is not enough thermal energy available (assuming approximately 350 K, or approximately 30 meV, operation). Rather, they can release a small amount of energy (350 meV in this case) and occupy the 9:8 GaN well ground state. This small amount of energy released is not enough to significantly excite defects.

Figure 6C:
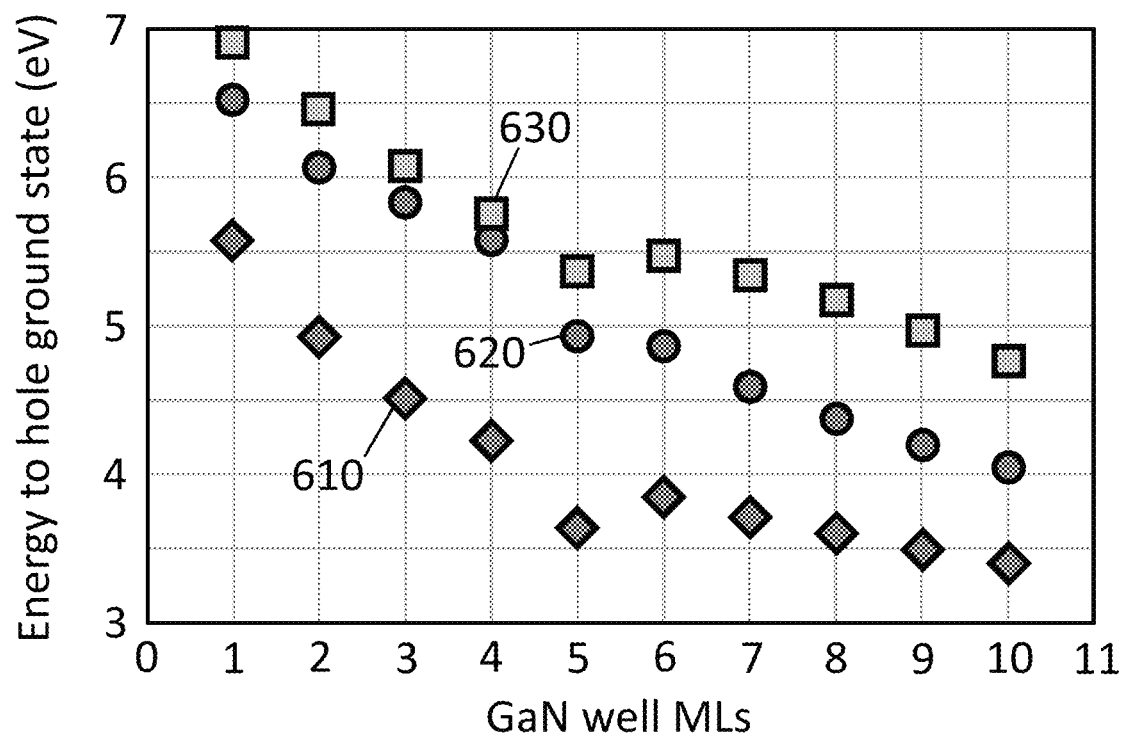
FIG. 6C is a plot showing a set of calculations which can be used to design a chirped-SPSL with non-resonant electron energy levels, and that allows for energy to be relaxed in small steps, rather than large steps, between adjacent wells, in accordance with some embodiments.

FIG. 6C is a plot showing a set of calculations which can be used to design a chirped-SPSL with non-resonant electron energy levels, and that allows for energy to be relaxed in small steps, rather than large steps, between adjacent wells. The y-axis in FIG. 6C is the energy from the hole ground state to an electron state. The x-axis is the thickness of the GaN wells, which are varied from 1 ML to 10 ML. The wells in this simulation all are surrounded by 8 ML AlN barriers. In other embodiments, AlN barriers can have varying thickness within a SL layer and have thicknesses from less than 1 ML to greater than 8 ML, or from less than 1 ML to 8 ML, or from less than 1 ML to 6 ML, or from less than 1 ML to 4 ML. In other embodiments, AlN barriers can have constant thickness within a SL layer and those constant thicknesses can be from 2 ML to greater than 8 ML, 2 ML to 8 ML, or from 2 ML to 6 ML, or from 2 ML to 4 ML. Curve 610 in FIG. 6C relates to the ground state of the electrons in the conduction band (i.e., electron state 1), curve 620 to the second excited state (i.e., electron state 2), and curve 630 to the third excited state (i.e., electron state 1), examples of which are shown in the three states of the electron wavefunctions shown in FIGS. 6A and 6B. In some embodiments, a chirp layer can be designed based on the plot in FIG. 6C, which shows the energy of each electron state with respect to the hole ground state, for different well thicknesses.

In some embodiments, thicker barriers in the chirp layers can effectively improve UV-C LED lifetime. As discussed above, and not to be limited by theory, in some cases once a defect has moved into the barrier center, it is practically transparent to electrons and holes, and therefore the likelihood of exciting such a defect is strongly reduced. In some embodiments, UV-C LEDs have superlattices with thick barriers and their output power increases with aging (e.g., as is observed in the power output 196 in FIG. 1H). Not to be limited by theory, when activated defects migrate into AlN barriers in which there is little electron-hole overlap, those defects are effectively deactivated. Therefore, in some embodiments, thick barriers help to clean defects from the active region. For similar reasons, thick barriers can be used not only in the chirp layer, but also in any other region of a semiconductor device, such as a UV-C LED. For example, thicker barriers can be used in the region where the radiative recombination occurs (e.g., the i-layer). One disadvantage of using thicker barriers is that wider barriers reduce the electron and hole mobilities. Therefore, a practical barrier thickness (in any layer of the device) will be a trade-off between improved defect performance versus poor carrier mobility.

The concepts described here can apply to devices where electrons travel between regions of different effective band gap, and therefore become "hot" at some point. This is of particular importance for UV-C LEDs where p-doping often involves a low-bandgap material, however, many other semiconductor devices (as described above) can benefit from the structures, concepts and methods described herein.

In some embodiments, the improved chirp layer structures described herein are applicable to binary UV-C LED devices (e.g., those using AlN/GaN SLs), and also to devices that rely on a ternary mix for carrier transport. Typically, those devices have no barrier against defect drift, and therefore the improved chirp layer structures described herein may be beneficial to conventional quantum well UV-C LEDs, and other LEDs or other semiconductor devices utilizing other material systems.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A semiconductor structure comprising:
    a plurality of first semiconductor layers comprising wide bandgap semiconductor layers;
    a narrow bandgap semiconductor layer; and
    a chirp layer between the plurality of first semiconductor layers and the narrow bandgap semiconductor layer;
    wherein:
        the plurality of first semiconductor layers comprise an n-type short-period superlattice layer (SPSL) and an unintentionally doped SPSL between the n-type SPSL and the chirp layer; and
        values of overlap integrals between different electron wavefunctions in a conduction band of the chirp layer are less than 0.05 for intersubband transition energies greater than 1.0 eV, when the structure is biased at an operating potential.

2. The semiconductor structure of claim 1, wherein the chirp layer is unintentionally doped.

3. The semiconductor structure of claim 1, wherein the chirp layer has a high hole concentration due to polarization doping.

4. The semiconductor structure of claim 1, wherein:
    the n-type short-period superlattice layer (SPSL), the unintentionally doped SPSL, and the chirp layer comprise alternating layers of GaN and AlN; and
    the narrow bandgap semiconductor layer comprises p-type GaN.

5. The semiconductor structure of claim 4, wherein:
    the AlN layers in the chirp layer have thicknesses that are from 2 monolayers to greater than 10 monolayers; and
    the GaN layers in the chirp layer have thicknesses that are varied from less than 1 monolayer in a region nearest the unintentionally doped short-period superlattice layer to greater than 10 monolayers in a region nearest the narrow bandgap semiconductor layer.

6. The semiconductor structure of claim 5, wherein:
    the AlN layers in the chirp layer have thicknesses that are varied from greater than 10 monolayers in the region nearest the unintentionally doped short-period superlattice layer to less than 1 monolayer in the region nearest the narrow bandgap semiconductor layer.

7. The semiconductor structure of claim 1, wherein the operating potential is within 1 V of a flatband condition.

8. The semiconductor structure of claim 1, further comprising an electron blocking layer between the plurality of first semiconductor layers and the chirp layer.

9. A semiconductor device incorporating the semiconductor structure of claim 1, wherein the semiconductor device is selected from the group consisting of light emitting diodes (LEDs), short wavelength LEDs, UV-C LEDs, UV-A LEDs, bipolar junction transistors, power transistors, vertical field-effect transistors, and semiconductor lasers.

10. A semiconductor structure comprising:
a plurality of first semiconductor layers comprising wide bandgap semiconductor layers;
a narrow bandgap semiconductor layer; and
a chirp layer between the plurality of first semiconductor layers and the narrow bandgap semiconductor layer;
wherein:
the plurality of first semiconductor layers comprise an n-type short-period superlattice layer (SPSL) and an unintentionally doped SPSL between the n-type SPSL and the chirp layer; and
values of overlaps between electron wavefunctions and barrier centers in a conduction band of the chirp layer are less than 0.3 nm$^{-1}$, when the structure is biased at an operating potential.

11. The semiconductor structure of claim 10, wherein the chirp layer is unintentionally doped.

12. The semiconductor structure of claim 10, wherein the chirp layer has a high hole concentration due to polarization doping.

13. The semiconductor structure of claim 10, wherein:
the n-type short-period superlattice layer (SPSL), the unintentionally doped SPSL, and the chirp layer comprise alternating layers of GaN and AlN; and
the narrow bandgap semiconductor layer comprises p-type GaN.

14. The semiconductor structure of claim 13, wherein:
the AlN layers in the chirp layer have thicknesses that are from 2 monolayers to greater than 10 monolayers; and
the GaN layers in the chirp layer have thicknesses that are varied from less than 1 monolayer in a region nearest the unintentionally doped short-period superlattice layer to greater than 10 monolayers in a region nearest the narrow bandgap semiconductor layer.

15. The semiconductor structure of claim 14, wherein:
the AlN layers in the chirp layer have thicknesses that are varied from greater than 10 monolayers in the region nearest the unintentionally doped short-period superlattice layer to less than 1 monolayer in the region nearest the narrow bandgap semiconductor layer.

16. The semiconductor structure of claim 10, wherein the operating potential is within 1 V of a flatband condition.

17. The semiconductor structure of claim 10, further comprising an electron blocking layer between the plurality of first semiconductor layers and the chirp layer.

18. A semiconductor device incorporating the semiconductor structure of claim 10, wherein the semiconductor device is selected from the group consisting of light emitting diodes (LEDs), short wavelength LEDs, UV-C LEDs, UV-A LEDs, bipolar junction transistors, power transistors, vertical field-effect transistors, and semiconductor lasers.

19. A semiconductor structure comprising:
a plurality of first semiconductor layers comprising wide bandgap semiconductor layers;
a narrow bandgap semiconductor layer; and
an unintentionally doped chirp layer between the plurality of first semiconductor layers and the narrow bandgap semiconductor layer;
wherein:
the plurality of first semiconductor layers comprise an n-type short-period superlattice layer (SPSL) and an unintentionally doped SPSL between the n-type SPSL and the unintentionally doped chirp layer; and
the unintentionally doped chirp layer comprises a SPSL with alternating wide bandgap barrier layers and narrow bandgap well layers, wherein the thicknesses of the wide bandgap barrier layers, or the thicknesses of the narrow bandgap well layers, or the thicknesses of both the wide bandgap barrier layers and the narrow bandgap well layers, change throughout the chirp layer.

20. The semiconductor structure of claim 19, wherein the thicknesses of the wide bandgap barrier layers are from 2 monolayers to greater than 10 monolayers.

21. The semiconductor structure of claim 19, wherein:
the n-type short-period superlattice layer (SPSL), the unintentionally doped SPSL, and the unintentionally doped chirp layer comprise alternating layers of GaN and AlN; and
the narrow bandgap semiconductor layer comprises p-type GaN.

22. The semiconductor structure of claim 21, wherein:
the AlN layers in the unintentionally doped chirp layer have thicknesses that are from 2 monolayers to greater than 10 monolayers; and
the GaN layers in the unintentionally doped chirp layer have thicknesses that are varied from less than 1 monolayer in a region nearest the unintentionally doped short-period superlattice layer to greater than 10 monolayers in a region nearest the narrow bandgap semiconductor layer.

23. The semiconductor structure of claim 22, wherein:
the AlN layers in the unintentionally doped chirp layer have thicknesses that are varied from greater than 10 monolayers in the region nearest the unintentionally doped short-period superlattice layer to less than 1 monolayer in the region nearest the narrow bandgap semiconductor layer.

24. The semiconductor structure of claim 19, further comprising an electron blocking layer between the plurality of first semiconductor layers and the unintentionally doped chirp layer.

25. The semiconductor structure of claim 19, wherein the unintentionally doped chirp layer has a hole concentration greater than $10^{18}$ cm$^{-3}$ due to polarization doping.

26. The semiconductor structure of claim 19, wherein values of overlap integrals between different electron wavefunctions in a conduction band of the unintentionally doped chirp layer are less than 0.05 for intersubband transition energies greater than 1.0 eV, when the semiconductor structure is biased at an operating condition.

27. The semiconductor structure of claim 19, wherein values of overlaps between electron wavefunctions and barrier centers in a conduction band of the unintentionally doped chirp layer are less than 0.3 nm$^{-1}$, when the semiconductor structure is biased at an operating condition.

28. A semiconductor device incorporating the semiconductor structure of claim 19, wherein the semiconductor device is selected from the group consisting of light emitting diodes (LEDs), short wavelength LEDs, UV-C LEDs, UV-A LEDs, bipolar junction transistors, power transistors, vertical field-effect transistors, and semiconductor lasers.

* * * * *